(12) United States Patent
Mayer et al.

(10) Patent No.: US 7,449,098 B1
(45) Date of Patent: Nov. 11, 2008

(54) METHOD FOR PLANAR ELECTROPLATING

(75) Inventors: Steven T. Mayer, Lake Oswego, OR (US); Jonathan D. Reid, Sherwood, OR (US); Mark L. Rea, Tigard, OR (US); Ismail T. Emesh, Gilbert, AZ (US); Henner W. Meinhold, Fremont, CA (US); John S. Drewery, Alameda, CA (US)

(73) Assignee: Novellus Systems, Inc., San Jose, CA (US)

( * ) Notice: Subject to any disclaimer, the term of this patent is extended or adjusted under 35 U.S.C. 154(b) by 627 days.

(21) Appl. No.: 10/739,822

(22) Filed: Dec. 17, 2003

Related U.S. Application Data

(63) Continuation-in-part of application No. 10/209,171, filed on Jul. 29, 2002, now Pat. No. 6,756,307, and a continuation-in-part of application No. 09/967,075, filed on Sep. 28, 2001, now Pat. No. 6,709,565, which is a continuation-in-part of application No. 09/412,837, filed on Oct. 5, 1999, now Pat. No. 6,315,883.

(51) Int. Cl.
*C25D 5/02* (2006.01)
*C25D 5/34* (2006.01)
*C25D 5/48* (2006.01)
*C25D 7/12* (2006.01)

(52) U.S. Cl. .................. 205/118; 205/123; 205/182; 205/210; 205/221; 205/222

(58) Field of Classification Search ............... 205/123, 205/182, 210, 118, 221, 222
See application file for complete search history.

(56) References Cited

U.S. PATENT DOCUMENTS

| | | | |
|---|---|---|---|
| 3,183,176 A | 5/1965 | Schwartz |
| 3,313,715 A | 4/1967 | Schwartz |
| 3,393,134 A | 7/1968 | Schwartz |
| 3,619,383 A | 11/1971 | Eisner |
| 3,619,384 A | 11/1971 | Eisner |
| 3,661,752 A | 5/1972 | Capper et al. |
| 3,749,652 A | 7/1973 | Eisner |
| 3,751,343 A | 8/1973 | Macula et al. |
| 3,849,270 A | 11/1974 | Takagi et al. |
| 3,904,489 A | 9/1975 | Johnson |
| 4,119,499 A | 10/1978 | Eidschun, Jr. |
| 4,227,986 A | 10/1980 | Loqvist et al. |
| 4,363,711 A | 12/1982 | Kuehnle |
| 4,452,684 A | 6/1984 | Palnik |

(Continued)

OTHER PUBLICATIONS

Contolini, et al., "Electrochemical Planarization for Multilevel Metallization", Lawrence Livermore National Laboratory, J. Electrochem Soc., vol. 141, No. 9, Sep. 1994, pp. 2502-2510.

(Continued)

*Primary Examiner*—Susy Tsang-Foster
*Assistant Examiner*—William T Leader
(74) *Attorney, Agent, or Firm*—Weaver Austin Villeneuve & Sampson LLP

(57) ABSTRACT

A disclosed form of mechanically assisted electroplating leads to a flat, thin, overburden. In one example, an accelerator is deposited on a copper surface and mechanically removed in a simplified CMP-like apparatus. The wafer is then plated in an electrolyte containing little or no accelerating additives.

39 Claims, 15 Drawing Sheets

U.S. PATENT DOCUMENTS

| | | | |
|---|---|---|---|
| 4,592,808 | A | 6/1986 | Doubt |
| 4,738,756 | A | 4/1988 | Mseitif |
| 5,034,753 | A | 7/1991 | Weber |
| 5,096,550 | A | 3/1992 | Mayer et al. |
| 5,158,860 | A | 10/1992 | Gulla et al. |
| 5,169,514 | A | 12/1992 | Hendriks et al. |
| 5,203,955 | A | 4/1993 | Viehbeck et al. |
| 5,256,565 | A | 10/1993 | Bernhardt et al. |
| 5,277,785 | A | 1/1994 | Van Anglen |
| 5,378,346 | A | 1/1995 | Ashiru et al. |
| 5,453,174 | A | 9/1995 | Van Anglen et al. |
| 5,462,649 | A | 10/1995 | Keeney et al. |
| 5,486,234 | A | 1/1996 | Contolini et al. |
| 5,557,027 | A | 9/1996 | Kemp |
| 5,807,165 | A | 9/1998 | Uzoh et al. |
| 5,843,296 | A | 12/1998 | Greenspan |
| 6,056,864 | A | 5/2000 | Cheung |
| 6,056,869 | A | 5/2000 | Uzoh |
| 6,083,835 | A | 7/2000 | Shue et al. |
| 6,103,628 | A | 8/2000 | Talieh |
| 6,121,152 | A | 9/2000 | Adams et al. |
| 6,143,155 | A | 11/2000 | Adams et al. |
| 6,152,586 | A | 11/2000 | Dealey, Jr. et al. |
| 6,153,521 | A | 11/2000 | Cheung et al. |
| 6,171,467 | B1 | 1/2001 | Weihs et al. |
| 6,176,992 | B1 | 1/2001 | Talieh |
| 6,207,572 | B1 | 3/2001 | Talieh et al. |
| 6,251,235 | B1 | 6/2001 | Talieh et al. |
| 6,315,883 | B1 | 11/2001 | Mayer et al. |
| 6,328,872 | B1 | 12/2001 | Talieh et al. |
| 6,344,129 | B1 | 2/2002 | Rodbell et al. |
| 6,409,904 | B1 | 6/2002 | Uzoh et al. |
| 6,413,338 | B1 | 7/2002 | DiPalma |
| 6,447,668 | B1 | 9/2002 | Wang |
| 6,478,936 | B1 | 11/2002 | Volodarsky et al. |
| 6,482,307 | B2 | 11/2002 | Ashjaee et al. |
| 6,534,116 | B2 | 3/2003 | Basol |
| 6,630,059 | B1 | 10/2003 | Uzoh et al. |
| 6,638,411 | B1 * | 10/2003 | Mishima et al. ............. 205/210 |
| 6,653,226 | B1 | 11/2003 | Reid |
| 6,756,307 | B1 | 6/2004 | Kelly et al. |
| 6,793,796 | B2 * | 9/2004 | Reid et al. ................. 205/102 |
| 6,797,132 | B2 | 9/2004 | Talieh et al. |
| 6,815,354 | B2 | 11/2004 | Uzoh et al. |
| 6,858,121 | B2 | 2/2005 | Basol |
| 6,863,795 | B2 | 3/2005 | Teerlinck et al. |
| 6,867,136 | B2 | 3/2005 | Basol et al. |
| 6,902,659 | B2 | 6/2005 | Talieh |
| 6,921,551 | B2 | 7/2005 | Basol |
| 6,946,066 | B2 | 9/2005 | Basol et al. |
| 7,129,165 | B2 | 10/2006 | Basol et al. |
| 2001/0013472 | A1 | 8/2001 | Nakamura et al. |
| 2004/0226827 | A1 | 11/2004 | Matsuda et al. |

OTHER PUBLICATIONS

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

Mayer, et al., "Method and Apparatus for Uniform Electropolishing of Damascene IC Structures by Selective Agitation", Novellus Systems, Inc., U.S. Appl. No. 09/967,075, filed Sep. 28, 2001, pp. 1-50.

Osterwald et al., "New Theoretical Ideas about the Action of Bath Additives During Cathodic Deposition", Galvanotechnik, vol. 66 (1975), No. 5, pp. 360-365.

Eisner, S., "Electroplating Accompanied by Controlled Abrasion of the Plate", Oct. 1971, pp. 993-996.

Osterwald, Jorg, "Leveling and Roughening by Inhibitors and Catalyst", Institute for Metallurgy of the Technical University of Berlin, vol. 17, No. 5, 1976, pp. 89-94.

Patton et al., "Sequential Station Tool for Wet Processing of Semiconductor Wafers", Novellus Systems, Inc., U.S. Appl. No. 10/693,223, filed Oct. 24, 2003, pp. 1-32.

US Office Action, mailed Dec. 12, 2007, for U.S. Appl. No. 11/065,708.

U.S. Office Action, mailed Nov. 20, 2007 for U.S. Appl. No. 10/824,069.

Notification of ownership transfer of certain patents owned by NuTool, Inc., 2007.

U.S. Appl. No. 10/824,069 filed Apr. 13, 2004.

Notice of Allowance, mailed May 15, 2008 for U.S. Appl. No. 10/824,069.

Office Action as mailed on Jun. 13, 2008 for U.S. Appl. No. 11/065,708.

* cited by examiner

METHOD FOR PLANAR ELECTROPLATING

CROSS-REFERENCE TO RELATED APPLICATIONS

This application is a continuation-in-part, claiming priority under 35 USC 120 from U.S. patent application Ser. No. 10/209,171 filed Jul. 29, 2002 by Drewery et al., and titled "Apparatus for Electrically Planarizing Semiconductor Wafers," now issued U.S. Pat. No. 6,756,307; this application is also a continuation-in-part of U.S. patent application Ser. No. 09/967,075, filed Sep. 28, 2001 by Mayer et al., titled "Method And Apparatus For Uniform Electropolishing of Damascene IC Structures By Selective Agitation," now issued U.S. Pat. No. 6,709,565, which in turn is a continuation-in-part of U.S. patent application Ser. No. 09/412,837 filed Oct. 5, 1999 by Mayer et al., and titled "Electroplanarization of Large and Small Damascene Features Using Diffusion Barriers and Electropolishing," now issued U.S. Pat. No. 6,315,883. These prior patent documents are incorporated herein by reference for all purposes.

BACKGROUND

Modern copper electroplating for Damascene processes proceeds by a "bottom up" fill mechanism that preferentially fills high aspect ratio features such as the trenches and vias on a wafer surface. This is accomplished by depositing copper geometrically along the contours of the wafer surface, including the corners at the base of recessed features. Unfortunately, this process does not fill and planarize large aspect ratio features and requires significant "overburden." Overburden is the additional copper deposited on the substrate to ensure that all low aspect ratio features are completely filled to the plane of the wafer isolating dielectric surface (the "field"). Since the bottom up fill does not occur in low aspect ratio features, the surface of the overburden typically follows the contours of the wafer surface recesses over these features. In most cases, the overburden on field regions is slightly thicker than the thickness of the Damascene layer, typically on the order of 1.2 times the depth of the deepest feature. So, for example, a damascene structure that has features 0.5 micrometers deep will require an overburden of approximately 0.7 to 0.8 micrometers.

Overburden is undesirable because it requires deposition of excess copper, that is essentially wasted, and because it requires an extra step of removing the overburden material. Thus, overburden represents additional materials costs (excess copper deposited) as well as decreased throughput/productivity. In current processes, overburden is removed by a planarization technique such as chemical mechanical polishing (CMP) or electropolishing. CMP is a relatively expensive process that uses generally corrosive chemical formulations on large pads to polish the surface of the integrated circuit. The process can be difficult to control and the polishing end-point can be difficult to detect. The high equipment cost, waste handling cost, and low throughput contribute to the overall expense of CMP. Also, with the introduction of porous low-k dielectrics in semiconductor devices, modification of traditional CMP processes will be required, as current methods can crack and/or delaminate low-k materials, which typically have a very low compression strength and extreme fragility.

Still further, measures must be taken to avoid metal "dishing" and dielectric erosion during CMP. Erosion of the dielectric occurs from over-polishing, which is necessary to make sure all the metal is removed from the top of the dielectric. Dishing occurs on the soft metal, and reduces the thickness of the copper interconnects and increases the electrical resistance. The overall changes in the planarity caused by dishing and erosion can also lead to difficulties in obtaining good focus across the die during subsequent lithographic steps. More importantly, topography introduced by these effects is replicated at the next metal level. This makes CMP progressively more difficult as metal layers are added to the structure.

Alternatives to CMP include electrolytic etching techniques such as electropolishing or electroless etching. Compared to CMP, these are relatively low cost techniques. They also provide much higher processing rates. Electropolishing is a method of polishing metal surfaces by applying an electric current through an electrolytic bath, and removing metal via electrolytic dissolution. The process may be viewed as the reverse of electroplating. Various electropolishing techniques have been described and appear to be promising. The following patent documents, which are incorporated herein by reference for all purposes, describe important implementations of the process. Reid (U.S. patent application Ser. No. 09/758,307 filed Jan. 9, 2001) describes a method of electrochemical planarization of metal surfaces in which planarization rates are modulated by tight control of the distance between a metal layer to be planarized and a planar cathode (in conjunction with a highly resistive electrolyte). Mayer et al. (U.S. patent application Ser. No. 09/967,075 filed Sep. 28, 2001) describe a method of planarization of metal layers in which a "pad" is used to create localized fluid agitation (and/or physical contact) in raised regions relative to recessed regions to facilitate planarization. Other relevant techniques are described in 10/209,171 filed Jul. 29, 2002 by Drewery et al. and U.S. Pat. No. 6,315,883. Each of these documents is incorporated herein by reference.

Although these inventions address the need for improved electroplanarization in semiconductor device fabrication, ideally an electroplating process would produce little if any overburden. Short of that, an electroplating process that deposits copper with reduced overburden and improved planarity would be highly desirable. Generally both electropolishing and electroetching have limited ability to planarize a "contoured" surface. In contrast, CMP selectively removes metal from exposed surfaces and not from recessed ones. Therefore, if a damascene structured surface is planarized after filling all the recessed features, in principle the more economically useful techniques of electropolishing, electrochemical etching, or electroless etching can be used to remove the field metal, thereby replacing the more costly CMP removal/planarization process. One approach to avoid metal overburden is an approach that attempts to combine chemical-mechanical, or electropolishing with electroplating in a single module, as described in Patent Application Publication US2002/0011416 A1, by Talieh. In that disclosure, electroplating and polishing occur simultaneously on different portions of a single wafer, with portions of the work-piece surface shuffling between sections of a process module (e.g. by rotation). One portion of the wafer is being electroplated while simultaneously another section is being polished. In addition to creating a planarized product with minimal overburden, it claims that performing the planarization and film deposition steps in this rapid back and forth manner improves film crystallographic properties.

Another class of methods useful in overburden reduction and planarization is referred to as "planar plating". As known in the art, so-called bottom-up fill (also referred to as "superfilling") methods are used to fill high aspect ratio (i.e., deeper than wide) recess features. However, due to their physical limitations, these processes are not capable of filling low aspect ratio (structure such as contact pads and the like). Since both of these feature types can exist on every damascene integrated circuit interconnect level, research into a potentially low cost "planar plating" methods has been pursued. Various planar plating methods that attempt to modify the otherwise conformal plating behavior over recessed low aspect ratio region by modifying the plating method (bath additives, transport properties, field effects, etc.) have been reported.

Reid (U.S. Pat. No. 6,024,857) describes a planar plating method using a bath additive, which acts to fill recess regions and "level" (planarize) a surface during metal deposition. The molecule is chosen to block transport to the exposed surface but is larger than the recess structure and unable to adsorb onto the regions within or on the side of the feature, thereby allowing metal to preferentially plate there.

U.S. Pat. No. 6,534,116 by Bulent describes a planar plating method that employs a plating solution containing an additive that accelerates the plating rate. During plating, additives are described as being continually adsorbed onto the plating surface from the solution, but are removed preferentially from the exposed surfaces by an "external influence". According to the disclosure, the additives remains in the recessed regions but is selectively removed from the exposed surfaces, enabling the process to produce a relatively planar deposit over a substrate initially containing a varying topography. The external influence used to selectively removes the adsorbate described in the '116 patent is a continuous pad rubbing. The patent states that the removal of the additive(s) adsorbed on the top portion of the work piece allows plating of the conductive material to take place preferentially in the cavity (recessed regions). The patent states that the process of removal must occur in such a fashion that the rate of removal of the adsorbate is greater than the rate of re-adsorption. The pad is brought in contact with the substrate, and is swept over the surface. The pad is described as having holes and creating a "mask" that is placed intermittently between the anode and the substrate, and moved with respect to the substrate, so that the holes sweep open and closed over the substrate, exposing and masking the anode. The process is termed "masked plating". The mask-pulsed plating method is described as utilizing the differences between response times of various additives to achieve enhanced plating into the various features of the substrate surface. The mechanism involves "sweeping" the top surface of the substrate (field regions) by the mask, which does not make physical contact with the regions inside the features.

The use of a pad in continuous contact with the wafer creates a unique set of problems, and the influence of adsorption dynamics (diffusion, surface reaction rates, local consumption rates, etc.) can make process control very difficult. Furthermore, the process plating selectivity will always be less than optimal between recessed and exposed regions because the finite rate of additive readsorption will tend to reduce the plating selectivity. The mechanism of masked plating, and specifically the role of the mask-plating pad in creating differential plating activity remains unclear and leads to doubt regarding optimization, the method's robustness, and overall utility. Understanding a plating mechanism impacts the ability to design better processes and tool implementation strategies. In addition, while the desired properties of the pad have not been specified clearly, the continual contact of the pad to the surface and the associated continual wear will require significant pad conditioning to maintain performance and selectivity. This substantially limits the overall pad life. Replacement of the mask plating pad is not only potentially costly from a material standpoint, but also from a tool utilization and uptime standpoint.

Controlini et al. (U.S. Pat. No. 5,486,234) describes a method of spin-spray etching particularly suited for removing both the field metal and metal embedded in a substrate at substantially the same rate by using a suitable metal etchant onto a spinning wafer. The process etches the metal evenly on the entire surface of the wafer and is useful after the wafer has been electroplated and planarized, for example, by electropolishing. While this technique is sited as a substitute for chemical mechanical planarization, because it is a conformal operation, it requires an initially planar surface to be useful.

We describe herein a new planar plating method and its associated mechanism, referred to as "selective acceleration planarization" (referred to herein as "SAP") having much greater planarity and reduced need for overplating. SAP employs the process step of exposing a wafer to certain plating additive (activation), followed by selective removal of the adsorbed additive. Removal is typically accomplished by rubbing (friction) the accelerator removal material with a stiff pad, selectively removing the additives from exposed regions. Effective selective additive removal subsequently enables field versus recess plating current-densities differences (referred to as contrast), and general planarization by plating (filling) recessed features at a substantially higher rate than in exposed (adsorbed additive free) regions. SAP plating is typically performed in a plating bath containing certain polarizing additives (known as suppressors) but is substantially free of accelerating additives. Suppressors are not effective in retarding the plating rate on surfaces having adsorbed accelerating additives. Note that it is not the desired objective of the SAP rubbing process to remove field exposed metal (via a CMP like planarization process), but simply to remove the accelerating plating bath additives from exposed surface. This process requires less work (e.g. lower pressure, rotation rate, time, etc.) than a process that removes field metal by CMP. The process forms a substantially planar copper electroplated layer over a surface comprising many recessed features. The peak-to-peak variation on the final plated metal surface is preferably significantly less than the height variation (topography) of the underlying seed layer (e.g., the resulting surface should contain height variation of not more than ~200 Å over 100 micrometer features).

SUMMARY

The inventors have discovered new approaches (selective acceleration planarization or "SAP") to plating metal onto a work piece while selectively maintaining a plating additive in recessed regions of the work piece surface. As with other planar plating processes, such approaches preferentially fill the recessed regions—even low aspect ratio features where plating is normally conformal—and thereby reduces overburden. But unlike prior methods, this can be accomplished without the need to continually remove the additive from the exposed regions during plating. Stated more generally, planar plating of the present invention preferentially fills the recessed regions without requiring special controls that balance the rates of additive deposition and removal. Importantly, the invention can be practiced without continually contacting the work piece with a pad during the plating operation, and leads to improved contrast between field and feature plating rates.

One aspect of the invention concerns methods of planar plating that are characterized by the following operations: (a) providing a work piece having a surface with recessed regions and exposed regions; (b) causing a plating additive (e.g., an accelerator) to become selectively attached to the surface in the recessed regions, with relatively little or no plating additive attached to an exposed surface; and (c) plating metal onto the surface after (b) is complete, whereby the additive selectively attached to the surface increases the rate of metal plating in the recessed regions relative to the rate of metal plating in the exposed regions. Often this means that during the plating in (c) no effort is made to selectively remove the additive from the exposed regions. In some cases, however, the method involves temporarily or periodically removing the plating additive from regions that were originally (prior to plating) recessed after the plating in (c) has commenced. This process enables the effective "shut down" of plating once the recessed regions have been filled and reached the plane of the field. Also, the method may require repeating (b) and (c) one or more times, for example, to remove accelerating chemicals from the surface as they become near, at or above the plane of the field In most cases, (b) and (c) are performed with solutions of different compositions, an activating solution and a plating solution respectively. The activating solution has a greater concentration of the additive than the plating solution. Because the additive adheres strongly to the work piece surface and is not removed during rinsing, drying, and during plating, it is typically unnecessary for the plating solution to contain any significant concentration of the additive, and in fact the plating solution may contain substantially no additive. Note that the term "additive" includes cases where a single plating additive compound is used and cases where multiple additive compounds are used. Generally (for a given choice of "accelerating" or "activating" additive and plating bath), the additive adhering to the work piece surface will "activate" that surface to increase the local plating rate. Various known (or newly discovered) "accelerator" compounds may be used for this purpose. Note that an accelerator compound may be used in combination with one or more other additives such as a less active accelerator (used, for example, to improve the smoothness of the deposit), a suppressor and/or a leveler.

In a typical example, process (b) (selectively attaching the plating additive) is performed in two parts: (b1) adsorbing the additive substantially uniformly on the work-piece surface, and (b2) selectively removing the adsorbed additive from the exposed "field" regions. The adsorbing operation may involve contacting the work-piece surface with an "activating" solution of the additive, e.g., the activating solution mentioned above. Contact may involve spraying, dipping, spin coating, etc. Alternatively, the additive may be adsorbed on the surface by electrochemical reduction of a precursor compound. An example of such a compound is a dimer of the accelerating additive itself (e.g. precursor dimercaptopropane sulfonic acid for accelerating additive 3-mercapto 1-propane sulfonic acid). Other means of forming an activated surface known to those of skill in the art will be suitable as well.

The selective removing operation (sub-operation (b2) may involve contacting the surface with a mechanically rubbing element such as a pad that selectively contacts the exposed region to remove the adsorbed additive. The pad should be highly non-compliant so as to make physical contact with the field region, but not contact the bottom or sides of the recessed features. A solution (referred to hereafter as a "rubbing solution") used in this process, acts as a lubricant and generally contains little or no accelerator compound or accelerator precursor. Among the desired properties of the rubbing lubricating solution are 1) minimum pad wear, 2) uniform and minimal mechanically field metal removal, and 3) rapidly and complete removal of the accelerator from the exposed planar surface (field) without 4) chemically inducing removal of the accelerator from the surface inside the recessed feature.

In one embodiment, the pad contacts the work-piece surface for a period of time, which ends prior to the beginning of (c) (plating). In another embodiment, the pad may periodically, intermittently contact the exposed region during plating operation (c), but not for the entire duration of (c).

As indicated, the invention provides particular benefit when used with substrates having relatively low aspect ratio recessed features. Thus, in some embodiments, the method will be practiced on work pieces having at least some of the recessed regions with aspect ratios of about 0.5 or below. Often the average feature depth is in the sub-micron scale, as is the case with many integrated circuits and other electronic devices.

In one application of the present invention, the work piece is a partially fabricated integrated circuit. If a damascene process is used, the recessed regions comprise trenches and/or vias, as well as very low aspect ratio "pads". Typically, the metal will be copper (e.g., elemental copper or a copper alloy).

Various techniques may be employed to control plating during (c). In one case, metal is electroplated onto the surface in a controlled potential mode. In another case, metal is electroplated onto the surface by applying a substantially constant current without pulsing the current.

While the plating process (c) has been described primarily as an electroplating operation, an analogous process sequence can also be performed with the appropriate operating conditions and chemical formulations using electroless plating. One simply needs to create a work piece with a selectively distributed accelerating chemicals (i.e. a surface treated with the appropriate materials so that a differential response is created to influence the electroless plating rate) and electrolessly plating the surface. In a particularly preferred embodiment performed after creating a selectively accelerated surface (e.g., with MPSA and mechanical rubbing), electroless plating is performed from a solutions containing 5 g/L $CuSO_4.5H_2O$, 14 g/L ethylene diamine tetra acetic acid (EDTA, a copper complexing agent), 10 ml/L 50% glyoxylic acid/wt in water, 100 to 1000 ppm L-62 suppressor, at 45 to 60° C., adjusted to a pH of about 11-13 (adjusted using, for example, tetramethyl ammonium hydroxide). The plating rate of the suppressed/unactivated region is from 10 to 100 Å/min, and the activated surface plating rate is from 100 to 2000 Å/min, depending on suppressor, pH, and bath temperature.

These and other features and advantages of the invention may be further understood by reviewing the description below in conjunction with the associated drawings.

DESCRIPTION OF A PREFERRED EMBODIMENT

Introduction

Figure 1:
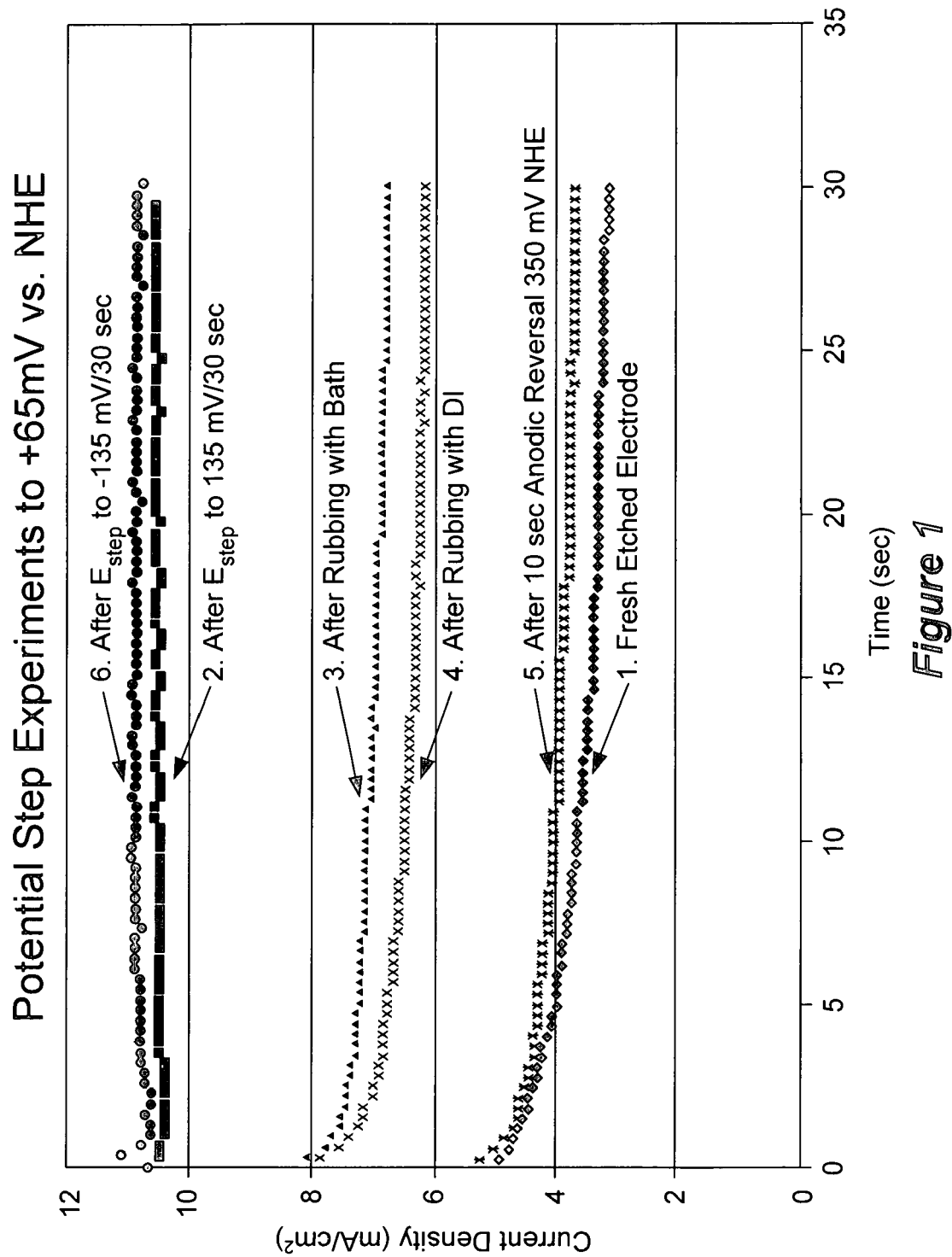
FIG. 1 is a graph showing potential/time curves using the activating precursor dimercaptopropane sulfonic acid, confirming the electrochemical formation of an accelerator from this molecule, its potential dependence of accelerant formation, and the principle of selective adsorption and mechanical removal of accelerating additives.

As explained, planar plating provides a method of plating metals onto a surface of varying topography and preferentially "filling" the recessed regions (including recesses with a low aspect ratio), thereby planarizing surface, typically a substantially globally flat surface such as that of a silicon wafer. The rate of planarization (termed the planarization contrast) is equal to the relative plating rates in the recessed and exposed regions of the surface and is a function of certain process and hardware variables. Methods and apparatus of this invention achieve improved planarization contrast. As explained below, various process parameters including process sequences and the choice of plating baths impact the degree of planar plating contrast.

Methods of this invention generally employ a work piece having (a) recessed regions (e.g., trenches and/or vias) where the surface contains a plating additive and (b) exposed regions (sometimes referred to as "field regions") where the surface contains less of the plating additive. The plating additive chemically and/or physically modifies the work piece surface to affect the rate of plating and/or the morphology of the plated metal. Typically, though not necessarily, the additive is an accelerator or an accelerator in combination with another additive such as a suppressor. During plating, the deposition rate in the recessed regions generally exceeds that in the field regions because the plating additive is preferentially located in those regions. Thus, the electroplated metal will have a relatively planar topology and relatively little overburden. Even recessed features with low aspect ratios will plate at a higher rate than the field regions. The invention is particularly useful for plating partially fabricated integrated circuits, as well as other types of work pieces, that have a range of surface feature dimensions, with at least some features being properly characterized as low aspect ratio features (features having aspect ratios of about 1.0 or below, or about 0.5 or below, or even about 0.2 or below). Formally, aspect ratio is the ratio of depth to width in a recessed feature. Deep narrow features have high aspect ratios. Wide shallow features have low aspect ratios (less than unity). In many applications of interest, such as integrated circuit fabrication applications, the features to be planarized have depths in the submicron scale, frequently on the order of 300 to 500 hundred nanometers or less. Preferably, the planarization produced using this invention is characterized by height variations of no more than a few tens of nanometers over a distance of many microns (e.g., no more about 20 nm over 100 micrometers of surface). In a specific example, the invention planarizes features that are at least about 500 nm deep with less than about 200 nm overburden; more preferably less than about 100 nm overburden.

Importantly, embodiments of this invention do not require the continuous removal of an absorbing additive during electroplating by, for example, continuous rubbing of the work piece with a pad. In many embodiments, this invention employs the following sequence of operations:

1. creating an activating film over the entire surface (by spraying, dipping, electrochemical reduction, or any other means of formation), followed by 2. selectively removing the deposited activating film in exposed regions, followed by 3. electroplating metal preferentially into the recessed regions using a bath containing limited amounts of the material used to form the activating film.

Operations 2 and 3 can be run sequentially over and over as required so that, once a previously recessed region reaches the plane of the exposed regions, it has its activating film removed. Also, these operations can occur sequentially at different portions of the same substrate at different times, repeatedly. For example, one region of the wafer may be having its activating film formed, while another region of the wafer is having its activating film removed selectively from exposed regions (but not plating). In another example, one region of the wafer may be having accelerating additive removed from its exposed surfaces, while another region of the wafer is having metal preferentially plating into recessed regions containing accelerators therein.

Equipment used to perform planar plating in accordance with this invention can be used, in some embodiments, to remove the resultant thin planarized copper film above the exposed features (overburden). Hence, a single apparatus can perform both planar plating and overburden removal. This enables high throughput integration of the plating and overburden removal operations. In one example, the apparatus employs a CMP-style pad and associated platen wafer holder and other necessary apparatus for 1) removing the activation layer on the field regions prior to substantial plating, 2) removing accelerator on the metal selectively deposited on the originally recessed features as these features emerge with plating (to avoid excess plating in areas originally recessed) and 3) to assist in the substantially uniform removal the overburden metal left above the field and features after the plating process is finished. Typically, the solution used in 3) (optimized to be a highly surface rate-controlled oxidation of the metal) is significantly different than that used in 1) and 2), but the design of the apparatus enables the duality of function simply by this change.

Activated Film Formation

It has been found that in baths containing dimercaptopropane sulfonic acid (DMPSA, sometimes referred to in the literature as SPS) or dimercaptoethane sulfonic acid (DMESA), for example, surface depolarization ("activation") of the accelerating additive can occur only after a high current density and/or potential is applied to the wafer surface. A sufficiently high current/potential applied for a sufficient time substantially reduces polarization. This effect remains even after returning to lower current/potentials. While we do not wish to be bound by theory, this threshold current/potential appears to result in one or more reactions that build up a strongly adsorbed activating product. More specifically, it appears that DMPSA is electrochemically reduced to MPSA (and DMESA to MESA), which is in fact the necessary accelerating compound. Regardless, the high current densities and associated threshold potential lead to activation of the accelerator and depolarization of the surface. Equally important, it has been found that some activated additive film remains relatively strongly bound to the wafer. In fact, it is "difficult" to restore the polarized state. It was previously found that significant current reversal (anode copper stripping) can return a surface to an unpolarized state (See "Integration of Copper PVD and Electroplating Processes for Damascence Feature Electrofilling", S. Mayer et. al. Electrochemical Society Proceedings, Volume 99-31, pg 174, 1999). Alternatively, the addition of a strong leveling agents to the plating solution (very strong polarizing compounds which are electrochemically consumed), can increase the polarization to areas which are non-polarized due to the presence of surface accelerator. Neither of these techniques is particularly conducive to creating sufficient contrast over very low aspect ratio recesses to selectively modify the surface polarization, as the SAP process requires. However, it has been found that mechanical rubbing and associated removal of the accelerator restores surface polarization. It is likely that the wearing/rubbing of the surface is effective in adding energy to the surface, breaking accelerator/metal bounds, and removing the adsorbed activating molecules.

An example of this behavior is shown in FIG. 1. Initially, an etched and cleaned surface was plated in a bath containing copper ion, acid, 50 ppm chloride, DMPSA and a polyethylene oxide (MW 1500) suppressing additives. On polarization to +65 mV (vs. NHE), a current of about 3.5 mA/cm$^2$ was observed (curve 1 of the figure). Next, the surface was polarized to −135 mV vs. NHE for thirty seconds (current transient not shown, current density increasing with time and relatively large at ~25 mA/cm$^2$). On returning the surface to the same initial polarization (−+65 mV vs. NHE) in the same bath, it was observed that the current was now three times greater (curve 2 of the figure). This surface had been "activated" by this bath and passage of a sufficiently high current and the presence of the electrochemically active accelerating additives.

FIG. 1 also shows the effects of "rubbing" the surface. If the surface is rubbed by hand with a cloth containing the same plating bath without its additives, and then plated at the same initial polarization (−65 mV, see curve 3), one observes a reduction in current, but not as small a current as the initial "pre-activated" condition (curve 1). Because the surface was etched and microscopically rough prior to the testing, it is likely that all of the accelerator in microscopically recessed regions could not be removed by this procedure. Further rubbing of the surface with a cloth containing deionized water resulted in a slightly smaller, more suppressed surface (curve 4). Subsequent to this treatment, the current was reversed for a short time (anodic current is passed, current not shown) and the accelerating film was removed. The current at this potential was once again in the non-active state (curve 5 same as curve 1). Finally, subjecting the surface again to the same activating potential lead to the depolarization and activation of the surface (curve 7, same as curve 2), repeating the process.

It has also been found that the dimer of MESA dimercaptoethansulfonic acid (DMESA) is similarly electrochemically active only after electrochemical reduction (in the manner of DMPSA).

The inventors have identified a general sequence for achieving differentiation in plating rates between exposed and recessed regions during electroplating (planar plating) using the DMPSA additive (or other electrochemically activated additive):

1) Placing a work piece in a electrolytic bath containing the electrochemically activated additive,
2) passing a reducing current at a sufficiently high current/potential in the solution containing the accelerator, thereby electrochemically transforming the accelerator molecule into an accelerating adsorbate/film,
3) selectively removing this adsorbate/film from exposed region of the surface, and
4) plating the work piece in a solution containing at least one reducible metal ion and one suppressing compound until the recessed region of the surface substantially reaches the plane of the exposure regions of the surface.

This and various other methods of the invention can be performed in a manner that does not require the continued presence of the accelerating additive in the actual plating bath, where planar plating is performed. Alternatively, if the accelerating additive is present, it is important to perform step (4) below the threshold potential (potential at which the accelerator is activated) so as not to regenerate the activating chemical on regions where it was removed in (3). Further, the invention can be performed in a manner that does not require balancing competition between the additive's rates of removal and readsorption. In contrast, the "masked plating" process (e.g., U.S. Pat. No. 6,534,116) performs all of these steps simultaneously in the same cell. While this may be advantageous or convenient, it generally does not always lead to the optimum performance that the SAP process enables. The requirement for simultaneous deposition and removal of accelerator means that a dynamic equilibrium is in place between addition and removal. There are three possible outcomes of this equilibrium. If accelerator adsorption is much faster than removal there will always be accelerator on the raised surfaces and therefore no planarization will occur. Alternatively and more desirably the removal rate may be high compared to the adsorption rate. In this case however the pad is polishing the wafer when this polishing is not necessary. This results in unnecessary forces being applied to the wafer. Thirdly the rates may approximately balance each other. In this case there is a high risk of variability in the process because of changes in adsorption and removal rates due to, for example, pad wear. Separation of the processes of adsorption and removal, in accordance with this invention, will eliminate these issues, allowing the separate optimization of these processes, which, in the other versions of planar plating, compete.

Thus, aspects of this invention involve separation of two or more of the four above-identified fundamental process parts. These sub-processes are tailored to achieve the desired result (i.e., efficiently producing a high degree of planarity with the least amount of metal in the exposed regions). For example, the sub-processes may be performed in process cells specifically designed for their individual purposes. Thus, the overall process can be optimized to achieve planarization contrast. For example, the wafer can be electrochemically activated in a cell and plating bath specifically designed to create an accelerated surface using the least amount deposit. This bath may contain no metal ion at all, and simply functions to convert the accelerator precursor to surface adsorbed accelerator. Next, the wafers surface is buffed in a separate module, and accelerator is specifically removed from exposed areas of the work piece. Finally, the wafer is plated in a bath containing metal ions, plating suppressors, but no accelerators or their precursors. The plating is terminated at the point were the recessed features (growing at several times the rate of the general surface) are coincident, resulting in surface planarization. Note that the above example assumes that the activating additive is applied to the work piece surface electrochemically.

As indicated, the invention is not limited to methods that employ additives that must be electrochemically reduced or otherwise "transformed" to form the required adherent activating film. Simple contact and adsorption can be used. Further, the "transformation" of dimeric precursor compounds is not limited to electrochemical activation. For example, reduction of compounds such as DMPSA and DMESA to an active form can in some cases be achieved by the electroless reduction of the sulfide moiety (using sufficiently strong reducing agent and appropriate temperatures as known in the art). The electroless approach has the advantage that the process does not require specialized apparatus to perform the electrochemical activation. Thus, in some embodiments, the invention may be practiced in a manner that does not require supplying current or applying a potential to the work piece during formation of the activated layer. In these embodiments, the apparatus used to form the layer need not include electrical contacts for the work piece.

Figure 2:
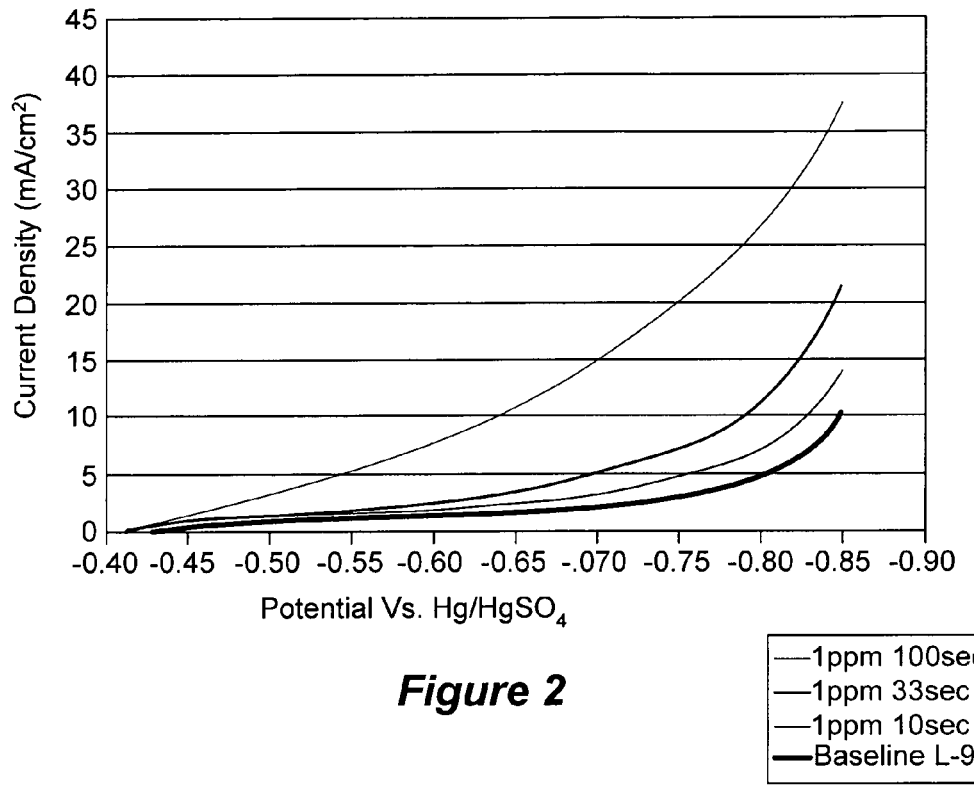
FIG. 2 is a graph showing the prolonged accelerator activity after adsorption from a solution of a chemically activating compound for various activating treatment conditions.

It has further been found that by simply exposing the surface of the work piece to certain accelerators like 2-mercaptoethane sulfonic acid (MESA) or 3-mercapto-1-propane sulfonic acid (MPSA) will activate the surface, without the need for electrochemical activation. FIG. 2 shows a voltammetric plots (current density versus potential for the treated electrode) for a substrate that has simply been exposed to the accelerator MPSA. A copper rod rotating at 800 rpm's was dipped in a solution containing the accelerator MPSA in deionized water for various exposure times and concentrations, then triple rinsed with DI water and plating in a solution of copper sulfate (40 g/l $Cu^{+2}$), sulfuric acid (30 g/L), chloride ion (50 ppm) and the suppressor Plurtaric L-62 (a copolymer of polypropylene oxide and polyethylene oxide, 0.1 g/L)). Between each voltage scan the surface was electropolished in phosphoric acid and rinsed in water to achieve a reproducible, highly microscopically smooth surface. In the absence of exposure to the accelerator, the surface exhibits very little current over a very wide range of potentials. With increasing "dosage" of accelerator, (which is related specifically the surface coverage of the chemically reacted surface, and is related to the product of the time of exposure and concentration of the activating solution), the surface became increasingly "depolarized" exhibiting larger "active" currents at any given potential. At sufficiently high doses, no further increase in plating rate was observed with exposure. In all of these cases, the surface was not significantly polarized, showing that the accelerator is absorbed without the application of a current. Accordingly one can apply this accelerator by a simple spray or immersion process, activating the surface everywhere. Other accelerators such as 2-mercaptoethane sulfonic acid (MESA) have been shown to absorb in the same way without the need to apply a current. And because the activating additives strongly adhere to the surface, the plating bath need not contain accelerator in certain embodiments of this invention. As known in the art, while many of the accelerator compounds are identified in their acidic form, it is understood the various salts of the acidic compounds will work equally well.

Figure 3:
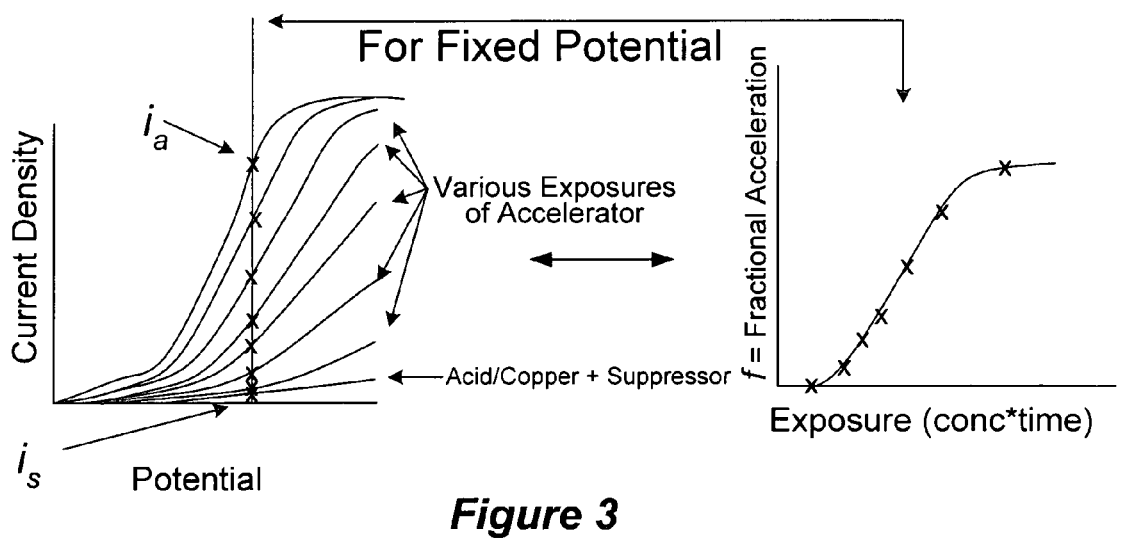
FIG. 3 shows the relationship between exposure to activating additive (in terms of concentration and time of exposure) and fractional acceleration, a dimensionless parameter indicating the degree of acceleration in comparison to complete suppression and complete acceleration.

From curves such as those shown in FIG. 2, one can construct a fractional acceleration vs. accelerant exposure relationship (FIG. 3) by plotting the dimensionless fractional acceleration f, $$f = \frac{i - i_s}{i_a - i_s}$$

as a function of exposure to accelerator. The variable i is the current at a given potential, and the terms $i_a$ and $i_s$ are the currents at the same potential from the fully activated and no activation exposure conditions. The maximum contrast in plating rate between a fully suppressed and fully accelerated surface can also be calculated as a function of potential as $$C_{max} = \frac{i_a}{i_s}$$

Assuming complete removal of accelerator from exposed regions during the removal step of the process, this is the maximum achievable ratio of plating rates between recess and exposed features and can be used to determine optimal operating points.

Integration of High Aspect Ratio Filling with the SAP Process

Bottom-up filling of damascene structures is known to lead to the creation of over-feature protrusion, sometimes referred to as "bump formation" or "overplating". Unstable bath additives, referred to as levelers, are often added to baths to suppress the continued accelerating effect on a surface as it protrudes beyond the field region. Levelers polarize the surface wherever they are present, and are generally present in the bath at a relatively low concentration and are consumed during the plating process. Because of this, they can polarize the general surface, but do not significantly interfere in the filling process because they cannot penetrate the deep, high aspect ratio structure. However, levelers are not useful in achieving low aspect ratio plating contrast because of the above stated mechanism (see, for example, "Leveling in Microprofiles in Electrodeposition", K. Jordan, Ph.D. thesis, University of California Berkeley, 1991). Formation of an overplated region is undesirable because of the added amount of topography requires extra planarization processing. Overplating does not have any known desirable benefits, but is a general phenomena associated with geometrically derived feature acceleration (see, for example, A Superfilling Model That Predicts Bump Formation", A. West, S. Mayer, and J. Reid, Electrochem. Solid-State Lett. 4, C50 (2001)). Having a surface topography that has both exposed and recessed areas with respect to the general field plane is substantially more difficult to planarize and is therefore generally undesirable.

Certain methods can be employed to avoid the formation of this undesirable topography. One general approach involves a preliminary step of plating metal onto the work piece under conditions that promote bottom-up fill in high aspect ratio features. In this approach, features of the work piece having relatively high aspect ratio are filled with metal, while features having relatively lower aspect ratio are not substantially filled. In one specific embodiment, a damascene wafer is first plated, prior to undergoing the SAP processes in a state-of-the art bottom-up-fill plating bath. However, in this case the plating is performed only to a point where all small, high aspect ratio features are filled. Generally the smallest features are filled, and will begin to overplate first. This trend is most pronounced in a dense region of high aspect ratio features. Because there is generally a large range of feature width and aspect ratio, this initial part of the process may fill all features with an aspect ratio great than about 1, for example, or create a structure with an aspect ratio generally less than 1. The field is left substantially unplated, and low aspect ratio structures (less than 1) remain unfilled. Little or no overburden metal has been added. The plating operation can be terminated, for example, when a fixed amount of current has passed or when in situ monitoring shows that high aspect ratio features have been plated. This constitutes a preferred incoming structure for the work-piece.

Preferably, the pre-SAP plating of the above process is performed without an activating solution. In a related embodiment, the featured wafer is first treated with an activating solution suitable for creating geometrically induced acceleration and plated to a similar stopping point. The activating solution in this case contains a relatively low concentration of chemically adsorbing accelerator (e.g., 3-mercapto-1-propane sulfonic acid, MPSA) compared to that used for the initial phase of the SAP planar plating process described herein. Of course, the main SAP plating itself is performed in a normal SAP plating solution (e.g., one containing little or no accelerator, but some suppressor). Again, the process is halted prior to the point before overplating has occurred, but many or all high aspect ratio have been filled.

In a particularly preferred embodiment performed after either of these small feature filling embodiments, but before the general SAP process, the surface is further plated in the same bath while it is intermittently rubbed. The object of this process is to remove the accelerator over the features as metal begins to protrude above them, and stop accelerated plating at the general level of metal over the feature coincident with the general field plane.

Creating Different Field Vs. Recessed Region Accelerator Adsorbate Concentration In a typical approach, the SAP methods of this invention begin by treating the work piece in a manner that provides a plating accelerating additive to the work piece surface. Typically, though not necessarily, this will be a non-selective process in which the additive attaches to both recessed regions and the field regions in approximately equal measure. Next, in a separate operation, the process selectively removes the additive from the field regions. In some cases, the selective removal may occur concurrently with the initial contact with the additive. More typically though, the removal operation is performed after the additive is applied to the surface non-selectively. In a preferred embodiment, the additive is removed by rubbing the surface with a CMP-like pad, while the surface is exposed to a suitable chemical which facilitates mechanically assisted removal of the adsorbed additive. Finally, the process electroplates metal onto the work piece. As indicated, the metal will preferentially deposit in the recessed regions, where the additive is concentrated.

In general, the "selective" removal refers to selective removal from exposed (vs. recessed) regions of the workpiece. Note that the selective removal operation may take place prior to or concurrently with electroplating. In some cases, the additive removal operation will finish before electroplating begins. And sometimes, the additive removal operation will stop and start one or more times during electroplating. The removal operation may also be used at an intermediate point in the process to remove accelerator from a surface on which only a fraction of the exposed surface is actually in the activated state. Various permutations on the general sequence are within the scope of this invention. Some of these will be described more fully below.

Treating the work piece to provide the plating additive typically involves contacting the work piece with a solution containing the activating additive in question. Contact can be by immersion, spraying, spin coating, vapor deposition, in situ synthesis on the surface, etc. The plating additive may attach to the surface by various mechanisms, including chemical adsorption, physical adhesion, and the like. After application of the additive to the work-piece surface, the wafer may be rinsed to remove entrained solution with additive (e.g. to avoid transference of the additive to subsequent processing modules and their solutions thereby avoiding contaminating the overall process). Depending on the type of additive used and the operational sequence used following its application, the wafer may be dried prior to selective removal of the additive from field regions, or kept wet. Because of the relatively stable and strong binding of the activating chemical to the surface, it is not generally necessary to process (e.g., electroplate) the wafer immediately after activation or after the selective removal step. The work-piece may be stored until it is convenient to perform further processing.

Activating, Selective Removal, and Plating Materials

In cases where the additive layer is formed from an additive-containing solution, a separate solution, having a different composition, may be used for selectively removing the additive from the field regions, and a third solution for subsequent electroplating operation. Of course, in some embodiments, two of more of these solutions may have the same or a similar composition. Generally, the first "activating" solution (for forming the additive layer) contains a relatively high concentration of the activating additive (e.g., greater than about 100 ppm). The second solution, used to selectively remove the additive, typically contain little or no additive, but contains components which make removal of the additive quick and easy (e.g., with minimal mechanical wear/force). Similarly, a third solution (the plating solution) may be substantially free of the relevant additive or contain only a very low concentration of such additive, and is designed to give a large plating rate difference between area on the surface with and without adsorbed accelerator. Note that this means that electroplating can proceed without a need to continuously remove the activating additive from the field regions. In some cases, it will not even be necessary to periodically or intermittently remove the additive. In one particularly preferred embodiments, the solution used for selectively removing the additive and the solution used for plating are the same, both containing very little or no accelerating additive while containing all other components necessary for achieving plating contrast (e.g. a suppressing compound, discussed more below).

Activators and Plating Bath Additives

It is important to draw a distinction between "activating" or accelerating additives and other additives. The additive preferentially found on the surface of recessed surfaces is, in accordance with this invention, an activating additive. Such additives are often referred to as plating accelerators. Often, the plating solution will contain one or more polarizing additives that loose their polarizing character on surfaces containing chemically adsorbed accelerating compounds. This class of compounds is generally referred to as suppressors. The plating solution will generally not contain significant amounts of active accelerator (concentration that will substantially depolarize the surface as a whole are to be avoided). In a particularly preferred embodiment, the plating solution contains a very low levels (e.g., less than about 1 ppm) of the electrochemically activated accelerators (for example DMPSA or dimercaptopropane sulfonic acid and DMESA or dimercatoethane sulfonic acid), which act to reduce the work piece's surface roughness.

Figure 4:
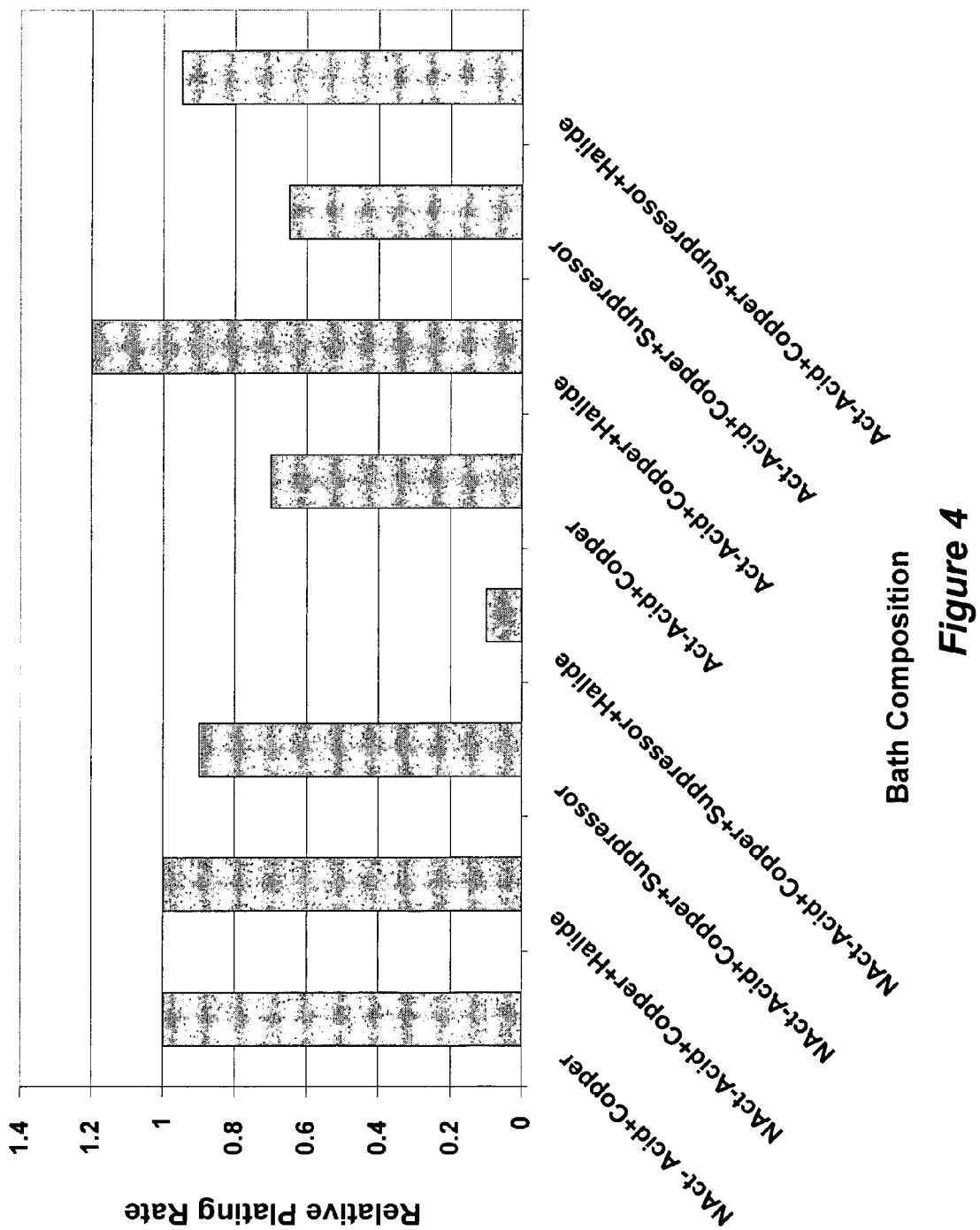
FIG. 4 is a graph showing relative plating rates of copper on a substrate from various plating solutions having different components (accelerator, suppressor, and halide).

It is useful to examine the influence of various plating bath components on the kinetics of the plating process. FIG. 4 graphically shows a comparison of plating rates at a the same fixed potential of acidic copper/sulfate plating baths both with and without adsorbed accelerator and with and without combinations of halide and suppressor additives. In the non-activated state, plating rate is not significantly effected by the presence of either halide or suppressor individually, but (as known in the art) the combination of these two components is highly effective in "suppressing" the deposition. Both the halide and suppressor are required to get a suppressing effect. When the surface is treated with activator, rinsed, and then plated in an acid/copper bath, the plating rate is significantly (but not substantially) reduced. Interestingly, an activated surface in a copper/acid/halide containing bath exhibits an increase in the deposition rate with respect to a surface in the same bath without activation. It may be that a catalyzing complex is created between the metal surface, the adsorbed accelerator, and the generally strongly adsorbing halide ion, to facilitate the normally slow $Cu^{+1}$ to $Cu^{+2}$ electron transfer step. Whatever the exact mechanism, some synergism exists between the halide and the suppressor and the halide and the accelerator. In order for the SAP process to be effective in planarizing a surface, contrast between the plating rates in a single plating bath with and without the accelerator present must exist, and the rate must be faster for the activated state. For example, while there is a difference in plating rates between activated and unactivated state in either a no additive bath or a bath containing suppressor only, the plating rate on the surface where the accelerator is removed would be faster, not leading to planarization. Desirable contrast can be obtained with a plating bath containing halide alone, or containing halide and suppressor. The greatest degree of contrast is generally, but not necessarily, found using the latter type of bath.

Solutions for Producing an Activated Film

As indicated above, separate procedures are employed to plate metal onto the work piece and to produce an activating film selectively in recessed regions of a work piece. These separate procedures may employ separate solutions such as a first "activating" solution to apply the activating film, a second "rubbing" solution used in conjunction with creating a different concentration of adsorbed accelerator between the field and the recessed region, and a third "plating" solution to perform plating. Most generally, the activating solution contains an activating additive or a precursor thereof, the rubbing solution contains component useful in removing accelerator from the wafer and preventing the adsorption of accelerator removed from the wafer from being absorbed into the pad, and the plating solution contains materials required for plating. Typically, the rubbing and plating solution will contain much lower concentration of the activating additive.

In some cases, the activated surface is created by simply contacting the work piece with free accelerator (or other activating agent) under conditions allowing the accelerator to adsorb onto the surface. This may involve no more than exposure by a simple spraying, immersion, or spin on technique for a short period of time as indicated above in the discussion of FIG. 2. Vapor or low-pressure techniques can also be used to deposit the molecules. Other processes such as in situ formation from dimers or other precursors in solution or vapor phase may be employed. Regardless of the process, the resulting additive film should be sufficiently adherent that it need not be continually reapplied during electroplating or be found in significant quantities in the plating solution When two or more different solutions are employed for these steps (e.g., a first one for applying an activating additive to the work piece and a second one, of a different composition, for removing the additive selectively and plating), the two or more solutions may be provided in separate process vessels (or chambers) such that the work piece is moved from a one vessel to the next sometime between application of the accelerator and plating. In another embodiment, both solutions are provided to a single vessel, but at different times or location on the work-piece. This generally requires that the first solution (for applying the activating additive) be removed prior to introduction of the plating solution or gradually replaced by the plating solution.

If the solution employed to apply the activating film contains the activating additive itself (as opposed to a precursor thereof), it should contain a sufficient quantity of the additive to facilitate rapid adsorption and film formation. Obviously, the actual concentration of such additive in the solution will depend upon the nature of the additive, the presence of any other components in the solution, and the work piece itself. In a typical example, the first solution contains between about 10 and 2000 ppm of the activating additive, and more preferably between about 100 and 1000 ppm of the additive. The exposure time likewise depends on the nature of the solution and work piece. In a typical example, a suitable exposure time ranges between about 5 and 100 seconds, more preferably between about 5 and 60 seconds. One can measure the degree of adsorption indirectly by monitoring the wafer polarization at various concentrations and exposure times. Preferably, the activating process will achieve near complete saturation of accelerator, and this is indicated by no significant change in depolarization with higher concentrations or longer exposures.

Examples of suitable activating additives include mercapto-group containing molecules such as 2-mercaptoethane-sulfonic acid (MESA), 3-mercapto-1-propane sulfonic acid (MPSA), 3-mercaptopropionic acid, mercaptopyruvate, 3-mercapto-2-butanol, and 1-thioglycerol. These and similar accelerator have been found to strongly adsorb to a work piece surface (e.g., copper metal) upon simple contact by spraying or immersion, but not substantially interfere with the kinetics of the overall charge transfer process, particularly in baths containing halides.

Figure 5:
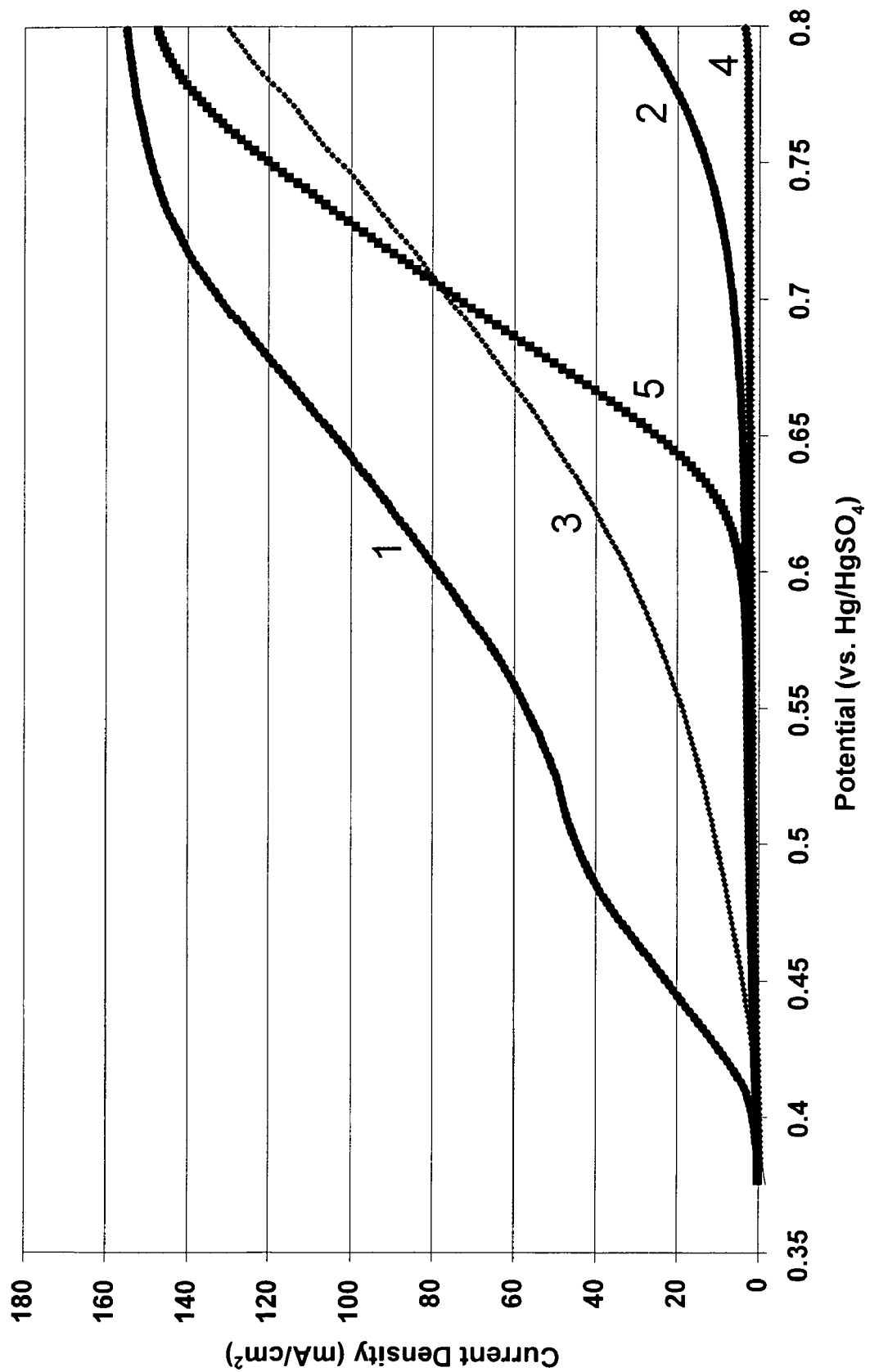
FIG. 5 is a chart showing voltametric responses of various surface treatments in suppressor and non-suppressor containing baths.

Suitable accelerators do not substantially suppress or retard the metal deposition charge transfer process themselves, and are believed to be effective in inhibiting access of a suppressor compound to the surface (thereby allowing a significantly higher contrasting plating with respect to the non-accelerated surface condition in the presence of the suppressor). Consider two specific additive examples: the use of 3-mercapto-1-propane sulfonic acid (MPSA) additive vs. 1-mercapto hexanol as potential acceleratants. Referring to FIG. 5, curve 1 shows a polarization sweep (current response to voltage sweep at 5 mV/sec) of an electropolished and rinsed copper disk rotating at 300 rppm in a acid copper plating solution containing 35 g/L Copper ion, 40 g/L sulfuric acid, 50 ppm Chloride ion. After performing the same surface preparation steps, adding about 0.2 ml/L of BASF Pluronic L-62 compound (a PEO-PPO polymeric suppressor) to this bath leads to substantial plating rate retardation (curve 2). This solution represents baseline suppressing solution. After again performing the same surface preparation steps, but then treating the copper disk by immersing it in 1 g/L MPSA for 10 seconds, rinsing the surface, and plating in this same baseline plating bath (curve 3), a slightly polarized surface with respect to curve (1) is seen, but a very substantially higher current with respect to curve (2) is observed. The activation treatment has activated and accelerated the plating in an otherwise suppressing bath. In contrast, using the same procedure but with 6-mercapto-1-hexanol treatment leads to a very polarized surface in both the suppressor baseline and non-suppressor containing plating solutions (curve 4 and 5 respectively). When no suppressor is in the solution, the current is initially suppressed by the 6-mercapto-1-hexanol, but this compound appears to break down at voltages above 0.6 V (vs. Hg/HgSO$_4$), and the voltage approaches that of the non-additive curve 1. When the surface is treated with 6-mercapto-1-hexanol and L-62 is in the bath (curve 4), the surface is very resistive to plating and stable. Results of this type of experiment indicate the maximum likely current densities possible for a recessed feature for this process if the action of the accelerating compound is to completely deactivate the suppressing compounds action (for example, by inhibiting the suppressing compound from adsorbing to the surface there). Obviously, if the "accelerator" significantly inhibits charge transfer in the suppressor free bath (e.g. initial portion of curve 5 of FIG. 5), it can not be used in obtaining current density contrast because its current density will be similar to that of the non-activated, suppressed plating condition.

In some cases, as described above, a precursor, such as a dimer of the accelerator, may be employed to form the activating film. Some physical stimulus, such as electrochemical reduction (at sufficiently high current density or potential) or the presence of a sufficiently strong reducing agent (e.g. dimethylamine borane or ammonium hypophosphite), is then used to convert the dimer in solution to a monomeric active film on the work piece surface. Examples of dimeric activator precursors that can be used with this invention include dimercaptopropionyl sulfonic acid (DMPSA) and dimercaptoethansulfonic acid (DMESA).

The activating solution is typically an aqueous solution and may contain small amounts of acids (0.2 to 2%/wt), found to stabilize the chemical in water. Alternatively, the activating solution can use a non-aqueous solvent (e.g. alcohols or ketones) that dissolve the additive at the desired concentration. Factors such as material and waste handling costs, activity of the accelerator in the solvent for adsorption to the substrate, and ease of drying influence the selection of the particular solvent. Other components of the activating solution may include dissolved copper ions, suppressing plating additives, levelers, or other materials that will not significantly interfere with the accelerator adsorption process.

In particularly preferred embodiments, the activating solution contains a concentration of additive that leads to the saturation of the surface with adsorbed accelerating chemical. At such high concentrations is has been found that the amount of adsorbed additive does not depend on the exact solution concentration or the surfaces exposure time to the solution. Under these conditions, the activating solution can be reused several times, treating many wafers, without concern for careful concentration control and process times.

Materials for Selectively Removing the Activated Film

The typical second step in creating highly selective planar plating according to this invention involves the selective removal of the activating chemicals/film from exposed "field" area, while not removing the same from recessed features. The process involves the mechanically facilitated removal of the surface adsorbed activator by the frictional work accomplished by the rubbing action between a friction creating pad and the work piece. Processes that are effective in removing accelerator and not underlying metal (good accelerator to metal removal selectivity) are preferred, because the uniformity of the overall metal deposit is not changed by the step (making integration with other process steps easier) and enable over rubbing to insure complete removal of accelerator globally without impacting film uniformity. The pad is moved relative to the work-piece while an applied (global, or superficial) pressure of from about 0.05 to 2 pounds per square inch is applied. The relative speed of motion between the surfaces is typically from about 0.02 meters/s to 2 meter/sec. The relative motion between the pad and the work-piece can be achieved using a number of different methods commonly known in the art of lens manufacturing and chemical mechanical polishing (CMP). These include orbital motion, linear motion, counter rotational, off axis counter rotational, and the like.

The material construction of the pad is typically an organic polymer, with relatively high compressive strength and is substantially non-compliant. This is a requirement so that the pad does not remove adsorbed accelerator from the surface inside the low aspect ratio feature. In many cases, the pad is formed using a layered structure, wherein a relatively thin film of a more-compliant, microrough and porous polymer (suitable for creating high local pressures and wear) is mated with a ridged backing (insuring that the pad will not dish into the feature bottom). The term "microrough" means that the surface is either porous or rough on the microscopic scale (local roughness correlation length <1 um). Suitable microroughness is found in air blown films and the like, and can be periodically conditioned using, for example, a diamond reconditioning tool, as known in the art. Typical materials of construction of the working surface include polyurethane and polyfurfal alcohol (PFA). One commercial pad found useful for this process is the IC 1000 pad, supplied by Rodel Corporation of Phoenix, Ariz.

While not wanting to be held to a particular theoretical mechanism by which the accelerating adsorbate is removed from the work-piece, it is generally believed that an important part to the process involves the combination of chemical and mechanical energy used to break the accelerator—(e.g. in a mercapto based accelerator, sulfur-) metal bound. Factors that influence the rate and degree of selective removal include parameters such as shear rate, pressure, roughness, lubricating liquid solvent and solutes, pad chemical composition, pad affinity for (reactivity with) the accelerator, and initial concentration of accelerator on the pad surfaces and bulk.

Figure 6:
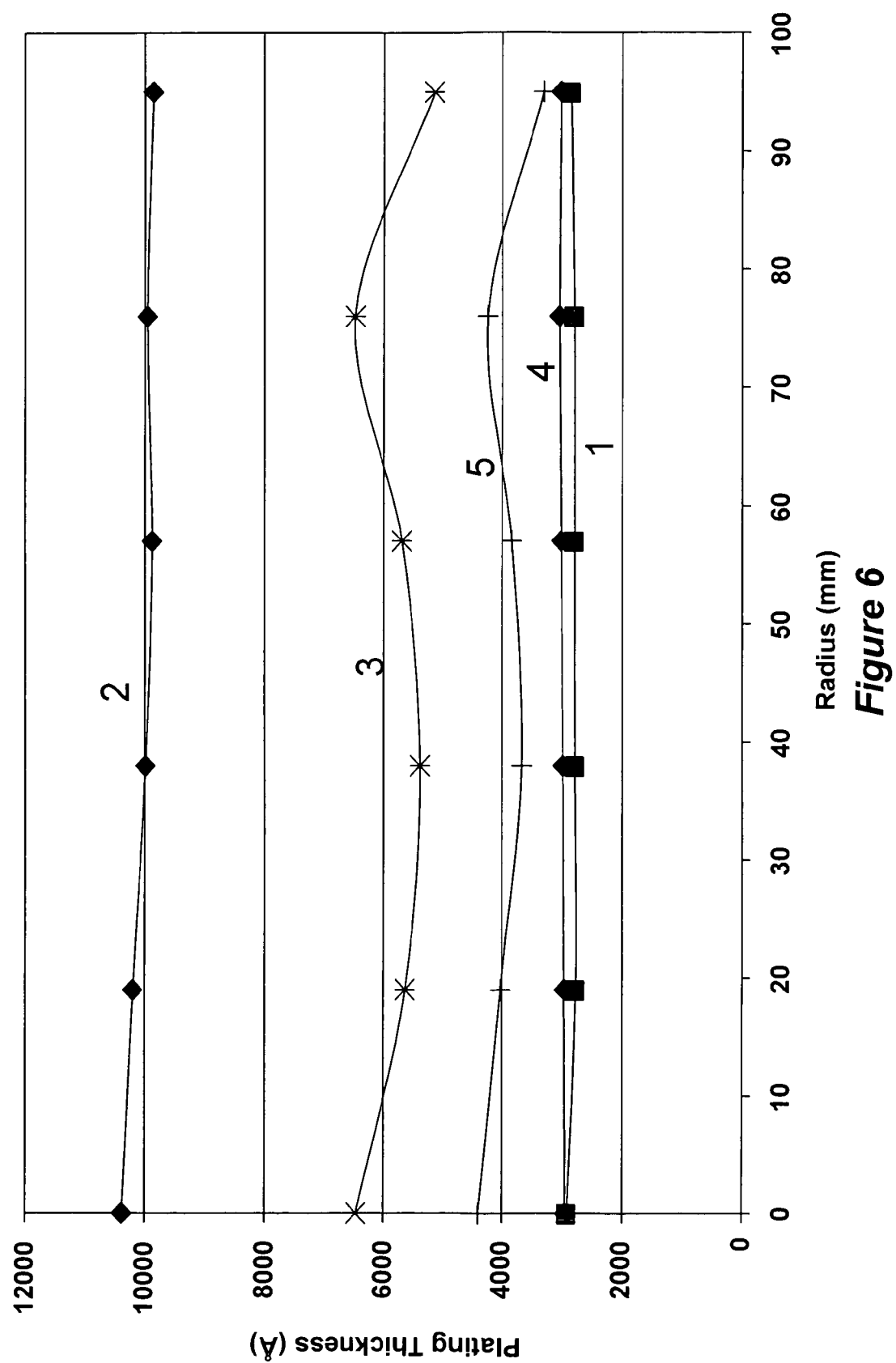
FIG. 6 is a chart showing the thickness profile of wafers having undergone various activation, rubbing, and plating treatments.

We have developed a technique that we found useful in measuring the effectiveness and rate of accelerator adsorbate removal. The method involves comparing the electroplating response of 1) activated wafers, 2) non-activated wafers, and 3) wafers activated and rubbed (under various process conditions) in a plating bath. A non-featured 200 mm wafer containing a plasma vapor deposited (PVD) copper seed layer (1250 Å Cu over 300 Å Ta) are used in this test. A non-activated wafer is plated in a Novellus Systems Sabre™ plating tool, for example, using a plating solution containing 35 g/L Copper ion, 40 g/L sulfuric acid, 50 ppm Chloride ion, and 0.2 g/L Pluronic L-62 (n.b. no accelerators or levelers). The wafer is plated for 300 seconds at constant potential (0.70 V vs. a Hg/HgSO$_4$ reference electrode). The reference electrode is ionically connected to the cell using a so-called Luggin-Haber capillary (see A. Bard and L. Faulkner, *Electrochemical Methods: Fundamentals and Applications*, John Wiley and Sons, Inc, New York, 1980, p 24.). The current, charge passed, and a map of the change in sheet resistance (before and after plating, converted to net plated film thickness distribution) are recorded. Difference Contour plot data is converted to radial averages and plated as thickness plated versus radius. Curve 1 in FIG. 6 shows a baseline profile of an untreated wafer plated in a suppressed bath. This is a suppressed wafer baseline condition. The process is repeated again, for a wafer that is activated prior to plating, yielding the activated wafer baseline condition (curve 2, same figure). The activation process involves pre-wetting the wafer with a stream of DI water (300 rpm, 500 cc/min, 10 seconds), spraying the wafer with a solution of 1 g/L MPSA in water (300 rpm, 100 cc/min flow, for 10 seconds), followed by rinsing with DI water (300 rpm, 20 seconds), and finally spin drying (1500 rpm, 25 seconds). The wafer is then plated in the same manner as above, and the same data set is collected. This is the activated wafer baseline, and depending on the potential and other conditions chosen, the activated wafer thickness and plated charge are 3 to 4 times that of the non-activated wafer.

Tests show that increasing the concentration or exposure time of accelerant does not significantly change the wear-removal or electroplating behavior of the surface, indicating that the surface is saturated with MPSA. Finally, an activated wafer is placed in a Novellus Systems orbital polishing tool (or other suitable polishing tool) where buffing conditions such as average pressure, pressure distribution, orbital rotation rate, pad material, rubbing solution (a lubricant not containing slurry) and time were varied. This creates an activated and rubbed wafer surface. After rubbing, the wafer is plating in the same plating solution under the same plating conditions. Curves 3 and 4 of FIG. 6 show the effect of buffing times on the plating response (15 and 60 seconds respectively) using an IC 1000 pad and lubricated by using the same solution used for plating at a 200 ml/min flow rate. The polishing tool used for this testing is able to apply different pressures to different portions (radii) or the wafer, and the undulations in the plating thickness response of the rubbed curves are likely associated with variations associate with the zoned pressure settings.

As expected, for a given set of operating conditions, the rate of adsorbed accelerator removal is generally found to increase with shear rate (a function of rotation speed) and applied pressure (removal rate proportional to rate of work). However, too much applied pressure can lead to damage of the underlying device structures, particularly now with the industrial trend to use mechanically weak, porous low-K dielectric materials. Therefore, it is desirable to use methods and materials to minimize the applied stress needed to remove the adsorbed accelerator, without substantially removing the underlying base metal. Use of excess force, non-optimal pads, poor lubricants and lubricant flow distribution may lead to unwanted excess and/or non-uniform removal of base metal.

Using the method described above to compare the effectiveness of accelerator removal, we have found that certain aqueous lubricant constituents affect accelerator removal. In general, acidic solution should be slightly oxidizing (e.g., containing approximately a 2-500 ppm level concentration of a oxidizer such as oxygen, hydrogen peroxide, permanganate, or ozone), and contain a copper soluble or complexing salt (e.g. sulfate, citrate respectively) at a pH where the metal is at least marginally soluble (~0.1 g/L Copper ion). It is believed that the presence of the oxidizer weakens the accelerator/metal bound by shifting the metal potential to a more positive (anodic) value. In the case of MPSA, the surface may becomes more positively charged under these oxidizing conditions, potentially weakening the mercapto-sulfur to copper bond. Of course, excess amounts of oxidizer will cause the underlying metal do corrode.

Similarly, the strong specifically adsorbing chloride ion is found to aid in the chemical/mechanical removal of the accelerator. Concentrations of from about 25 to 750 ppm are found to be useful. Finally, a chloride activated suppressor (e.g., PEO/PPO type polymers, about 0.05 to 0.5 g/L) is useful in obtaining the benefit of weakening the mercapto-metal bound, without the undesirable high metal corrosion rate typically catalyzed by the chloride ions presence. The suppressor also acts as a wetting agent/surfactant and a lubricant. As a specific example, an oxygen saturated solution containing 40 g/L sulfuric acid, 30 g/L copper sulfate, 12 g/L Pluronic L-62, and 250 ppm chloride ion was found to be highly effective in selectively removing accelerator from activated wafers. Alternatively, more neutral lubricating solutions (pH adjusted with, for example tetramethylammonium hydroxide), containing the copper complexing agent such as citric acid or glycine were also found effective in selective accelerator removal. In this case, the metal surface is believed to is oxidized (e.g. cuprous oxide), weakening the accelerator metal bond and making the surface layer more easily removed (along with the attached accelerator) by the mechanical action of the pad. Typically concentrations of about 0.4 to 4 g/L glycine can be used. In this case either very low levels of oxidizer (e.g. saturated oxygen, with less than 1 g/L hydrogen peroxide) or less glycine (about 0 to 2 g/L) and a high concentration of hydrogen peroxide (about 10 to 100 g/L) are suitable. As a specific example, a solution containing 0.5 g/L glycine and 15 g/L peroxide flowed at a rate of 150 ml/min through a IC1000 pad with orbital radius of 16 mm and a rotation rate of 600 rpm, was found to be highly effective in rapidly removing accelerator without significant unwanted removal of the metal base layer.

As mentioned above, the pad is typically a polymeric material. We have found in our course of investigations, that some of the accelerating material is often transferred to the pad as part of the removal process. In one set of experiments we ran a non-activated wafer through the buffing process just after an activated wafer was run. The transference of activator from the pad back to the unactivated wafer is shown in FIG. 6. The post-plating film thickness of an activated/rubbed wafer (FIG. 6, curve 3), and a sequentially run unactivated/rubbed wafer (FIG. 6, curve 5) were characterized by the method describe above used to determine polishing accelerator-removal effectiveness. Note that the unactivated wafer which is rubbed with a pad right after that pad rubbed the activated wafer is partially activated itself (i.e., curve 5 is higher than curve 4, though not as thick as curve 3, showing that the pad is absorbing accelerator from the work-piece as part of the process of accelerator removal. This activation by transference is found to go away after processing two unactivated wafers through the rubbing process. It is likely that the accelerator is being dynamically removed by the lubricant during the process. Therefore, the use of a pad with a strong adsorption characteristic for the accelerator, combined with a lubricating solution which is effective in rapidly and effectively removing the accelerator from the pad, while not chemically removing the accelerator from the work-piece (inside the features), is desirable.

Alternatively, the process of acceleration adsorption to the pad from the work-piece, coupled with a pad regeneration process that removed the accelerator, can be run sequentially any number of times to achieve the desired goal of accelerator removal from the work-piece. For example, a pad with significant accelerator adsorbed could be refreshed by exposing it to a strong oxidizing solution (hydrogen peroxide in acid), a strong reducing solution (e.g., about 20 g/L dimethylamine borane), or by passing a metal (free of accelerator) over the pads surface, transferring the accelerator to the metal. The pad can also contain small amount of powder metal which can be removed or replenished. The relative affinity of the particular accelerator to the particular pad will determine what process and choice of materials is best suited for a given application (e.g., by running a material in contact with the pad to extract the accelerator). Another embodiment of the same general principle involving the process of accelerator removal to a pad, and regeneration of the pad, separated temporally and/or spatially, are not outside the scope of this invention, and may be important in maintaining a highly effective SAP process.

Electrolytic Solutions for SAP Plating

As indicated, the plating solution contains a reducible ion (e.g., copper) to allow electroplating. This solution may be related to conventional plating solutions, but preferably has relatively little activating additive so that the process need not employ any special mechanism to remove that additive from the surface. Typically, the plating solution will contain no more than about 10 ppm by weight of a chemically activated accelerant in the solution (or a form of the additive that would be readily activated during electroplating). In a specific application, the electrolyte used with this invention can be very similar to those used in the current IC damascene copper electroplating (electrofill baths). In one example, it includes a copper sulfate/sulfuric acid solution, a PEO/PPO-type suppressor (see below), and chloride ions. Other bath chemistries may be employed for other types of electroplating. Because the plating bath contains relatively low concentrations of reactive accelerator, it will typically have a much longer useful lifetime than comparable conventional solutions that have relatively large quantities of such accelerator, reducing the need for bath additive concentration metrology.

The plating baths generally contain suppressors molecules with molecular weight from 500-10,000 (e.g., various linear and block polymers and copolymers of polyethylene and polypropylene oxides in the specified weight range). These additives can "polarize" the electrochemical interface (increase the necessary applied voltage to obtain the same current with respect to the no-additive case). A small concentration of halide ions (e.g., chloride and/or bromide) is generally employed to facilitate the polarizing behavior of the suppressing molecules. While not wanting to be held to any specific model or theory, the halide ions are thought to physically form a bond or complex with the suppressor. Because the halide ion is generally concentrated at a surface by its specific adsorption character, the polymer also is concentrated there. This adsorption of the suppressor onto the metal surface interferes with various physical and chemical kinetic processes related to the overall electrochemical deposition process, causing the surface to become significantly polarized.

Example Process Flows

Typically, methods of this invention begin with global activation of the work piece surface by a variety of means including, but not limited to (1) dipping the surface in a solution containing an activating compound, (2) spraying the surface with a solution containing dissolved activating compound, (3) drying a surface of a liquid containing dissolved activating compounds or activating precursor compounds (4) depositing the material from a vapor containing the activating compound, (5) electrochemically transforming a compound to form a chemically active accelerating compound and (6) electrolessly forming the activating compound. "Global activation" means that the entire surface, including both exposed and recess regions of the surface, are activated by the relevant additive.

After the surface is globally activated, the activator is selectively removed from the exposed regions to create a differential concentration of activating additive on the exposed and recessed surfaces. As indicated, this can be accomplished by selectively contacting the exposed regions with a pad or other mechanical element. CMP type polishing pads may be used for this purpose. Other mechanisms for selectively removing additive from the exposed surfaces include grazing angle ion bombardment or grazing angle laser ablation. Irrespective of the exact method of removing the film, after this selective removal procedure, a surface with activating film predominantly in the recess region results.

While this disclosure is not dependent on any particular removal mechanism, selective removal of the accelerating film may involve any one or more of the following:

incorporating or reacting the film material into/with the pad,
  buffing the surface while flowing a solvent with solutes over the surface, to facilitize the dissolution of the film into a flowing solvent,
  forming aggregates or particles of accelerating film and mechanically removing it from the surface (rinsing them away),
  forcing the film material to become incorporated in the underlying metal (thereby lowing the surface concentration),
  striking the surface with grazing angle high energy particles, using the momentum of the particles to eject or sputter them off the accelerator, In some embodiments, it may be necessary to perform a separate rinse operation after the pad or other element has been separated from the work piece surface.

Figure 7:
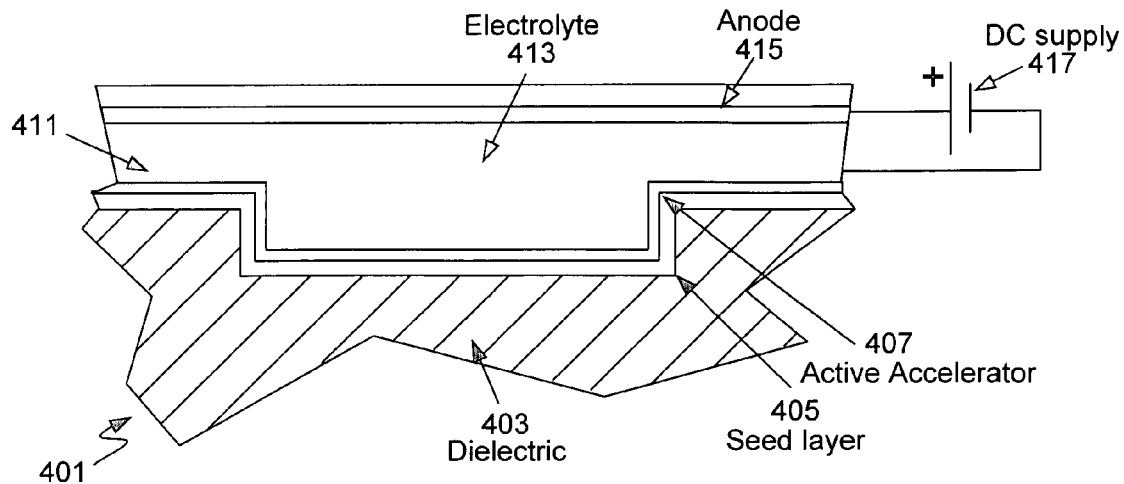
FIG. 7 is a schematic representation of a work piece surface in the first stages of planar plating with the uniform formation of an accelerating layer.
Figure 8:
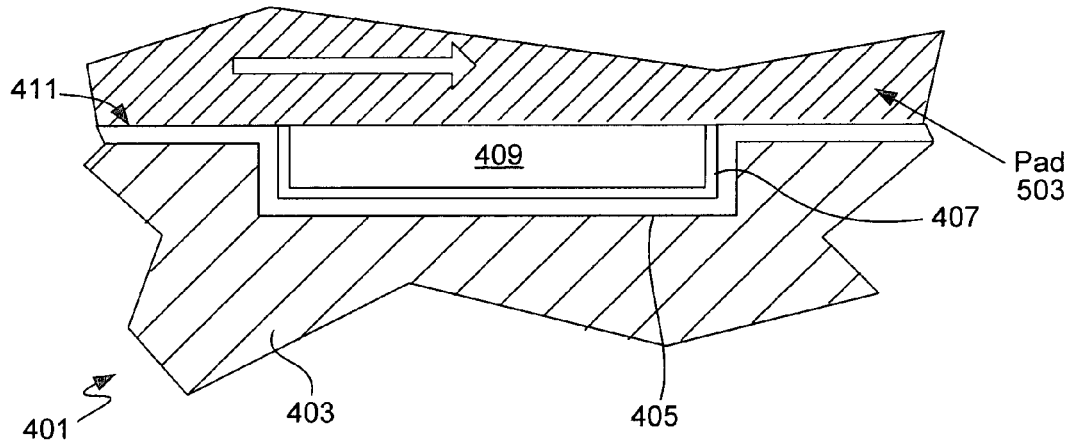
FIG. 8 is a schematic representation of the work piece surface of FIG. 7 being mechanically contacted with an element for removing the accelerating layer from exposed regions of the work piece.
Figure 9:
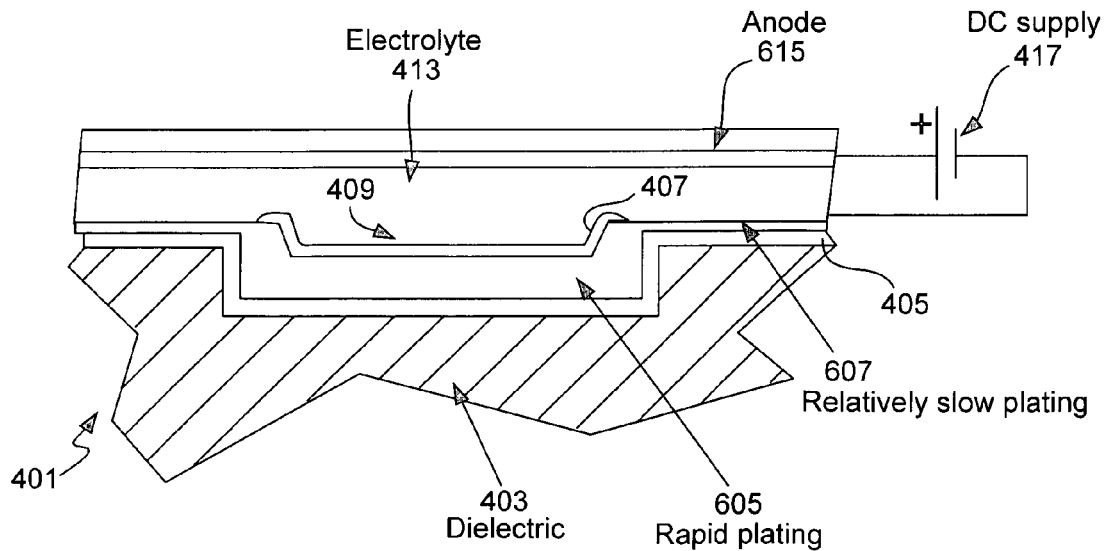
FIG. 9 is a schematic representation of the work piece partially plated after activation and mechanical contact as in FIG. 8.

FIG. 7 shows the effect of forming an activating film on the surface. FIG. 8 shows the effect of mechanically "rubbing" the exposed regions of the surface to selectively remove the activating additive on those regions. And FIG. 9 shows the effect of then plating the surface in a plating bath free of (or nearly free of) the activating additive.

In FIG. 7, a work piece 401 comprises, in relevant part, a dielectric layer 403, a conductive seed layer 405 (e.g., a thin PVD deposited copper layer), and a layer 407 of activating additive that adheres to seed layer 405. In some embodiments, the seed layer has also had some plating performed on it (to fill high aspect ratio features) but the structure over low aspect ratio features is substantially the same. As shown, layer 407 globally covers the work piece top surface including both recessed regions 409 and exposed (field) regions 411. Importantly, the recessed region 409 can have a relatively low aspect ratio in the ranges identified above. As indicated above, filling such features using conventional processes requires extensive overburden and a further planarization step.

The activating additive layer 407 may be formed by any of the techniques identified above; e.g., the passage of current in a bath containing an electrochemically active accelerator, by exposure to a self-activating accelerator, or by immersion or otherwise exposing the surface to the combination of an electrochemically active accelerator with a reducing agent (electroless deposition). To the extent that the additive layer is formed electrochemically, electrolessly, or by simple adsorption during liquid phase immersion, the apparatus will contain a chamber for holding the work piece in an electrolyte 413. If the apparatus allows for electrochemical activation of the additive, then it must include an anode 415, a power supply 417, and electrical connections for coupling power supply 417 to anode 415 and for coupling power supply 417 to work piece 401. During electrochemical activation of the additive, the work piece serves as a cathode in an electrolytic cell.

As shown in FIG. 8, a pad 503 or other globally flat mechanically contacting element moves over the surface of work piece 401 to selectively remove the active additive film 407 from field regions 411, while allowing it remain in recess 409. An arrow within element 503 indicates that it moves with respect to the work piece surface to mechanically remove the additive film from the field regions 411.

When work piece 407 is electroplated in a bath containing metal ions and suppressing compounds, with no active accelerating compounds (or at least a sufficiently small concentration of such compounds that plating on the exposed regions does not accelerate significantly), recessed regions grow at a higher rate than field regions. This is shown in FIG. 9, where plated metal 605 in recess 409 grows more rapidly than plated metal 607 in field regions 411. Note that at least part of the plating process is conducted without pad contact (as indicated in FIG. 9). Hence, the detrimental effects of pad contact (delamination and/or destruction of low-k dielectrics) are reduced in comparison to prior planar plating processes.

As indicated, the surface concentration of accelerating additives should remain at a greater level in recess 409 than in field region 411 during the plating operation. This is easily accomplished using a plating solution that either contains no accelerating compounds or contains precursors of such accelerating compounds that are activated only at a potential/current not encountered during electroplating. In one embodiment, a single solution containing electrochemically active precursors is used for both global activation and plating. The active film is formed from the solution using a first potential/current and metal is electroplating from the solution using a second potential/current (lower magnitude) under which the accelerator precursor does not react to produce additional accelerating film. In this embodiment, to prevent significant amounts of metal from plating in the field area simultaneously with the formation of the globally activated film, the method may periodically remove activating additive from the field region. Otherwise, there will be a to remove more field metal in subsequent processing.

Figure 10:
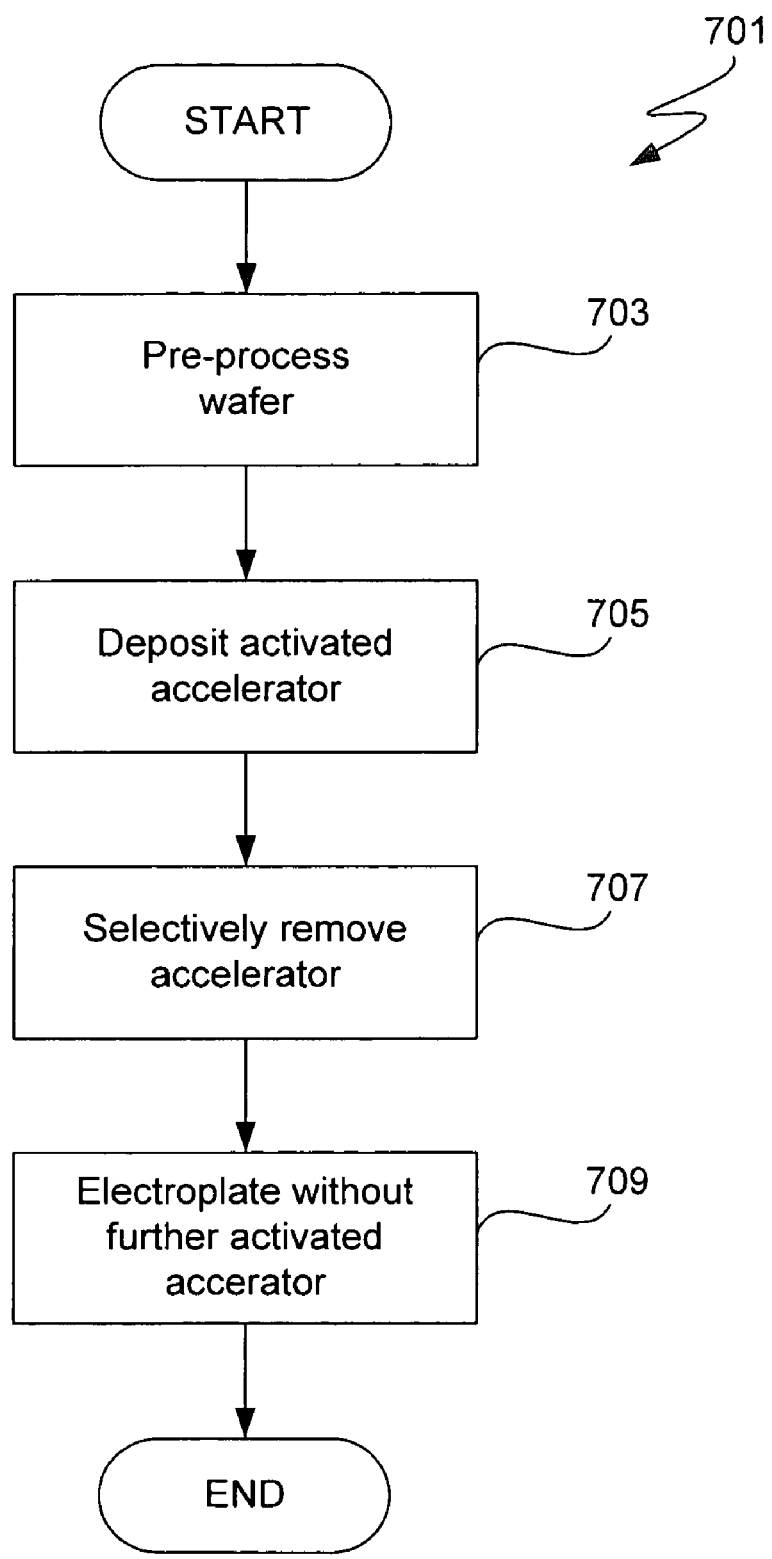
FIG. 10 is a general flow chart for a planar plating process in accordance with this invention.

FIG. 10 presents a process flow for one example of a planar plating process in accordance with this invention. Note that while the process is described as being applied to a semiconductor wafer (e.g., one or more partially fabricated integrated circuits, displays, or other electronic devices), the invention is not so limited.

As shown in FIG. 10, a process 701 begins at block 703 with one or more optional preprocessing operations used to prepare a wafer surface. These operations may comprise one or more of wetting with water and/or a surfactant, annealing (with or without oxidative or reductive treatments), and pretreating in a manner that produces bottom-up fill in small structures during electroplating while depositing relatively little copper on the field.

Next, at a block 705, the wafer is contacted with a solution in which the accelerating film is formed globally (in both recessed and exposed regions of the wafer surface). As indicated, the solution composition depends on whether the activating film is deposited electrochemically, electrolessly, by simple adsorption, or some other method. The associated apparatus and process conditions likewise depends on the film formation mechanism.

After the film is formed globally, it is removed locally from the exposed surface regions of the wafer. See block 707. This selective removal operation produces a surface condition as depicted in FIG. 8, for example. If the activated accelerator was formed electrochemically in operation 705, for example, then operation 707 is typically performed with little if any passage of current.

Finally, at a block 709 in the depicted process, the surface is plated in a bath containing very little or no accelerating compound and, typically, a highly active suppression chemistry. The initial phases of such plating operation may produce a structure as shown in the cross-section of FIG. 9.

Note that there may be some overlap in operations 705, 707, and 709. For example, in the case of the electrochemically activating processes, the activation may be performed in the same electroplating bath as that used to fill small high aspect ratio features. Further the activating film may be by formed during an initial phase of the electroplating process, where, for example, the metal is deposited at a sufficiently high current or potential for a short period of time (2-20 seconds) to create the activating layer. Thereafter, the current and/or potential are reduced so that further formation of the activating film is avoided. The selective removal of activating film from exposed regions may take place during the initial phases of electroplating or while the activating film is being formed.

If uncompensated, the local accelerated plating will create a protruding surface features. These protruding features result from a phenomenon referred to herein as "overplating". If the planar plating process proceeds in a manner in which the activated recessed regions are allowed to continue to grow at a higher rate than the planar surface, eventually the metal plated over the recessed regions will protrude above the slower growing metal plated over "suppressed" field regions.

One way to minimize overplating is to calibrate the process based on the amount of charge required to fill all previously recessed features and then "time" the process by monitoring the total charge passed to the wafer. While this procedure can work well, it can present challenges due to variations in feature sizes across the wafer and from one wafer to the next and slight variations in plating rates resulting from difficult to exactly control processing conditions.

An alternative endpoint technique makes use of optical imaging of the wafer surface. As a practical matter, ridges only a few hundred angstroms in height are clearly visible when the wafer is illuminated at an angle. Using a CCD camera (or other suitable detector) combined with flash illumination employing either white or monochromatic light, a magnified image of the wafer surface may be captured. Image analysis is then performed to determine whether the endpoint has been reached. Edge detection followed by RMS variation calculation is a simple way to determine the number of sharp features in the image. More complex two dimensional image transformations (by Fourier or other techniques) may also be used to find an "average" endpoint. Another technique that has been used in similar situations is the sampling of 'laser speckle' using the light reflected when a laser exposes the wafer surface at a glancing angle. Other endpoint techniques will occur to those of skill in the art. Both of these techniques can be incorporated into the plating apparatus for more efficient processing.

Figure 11A:
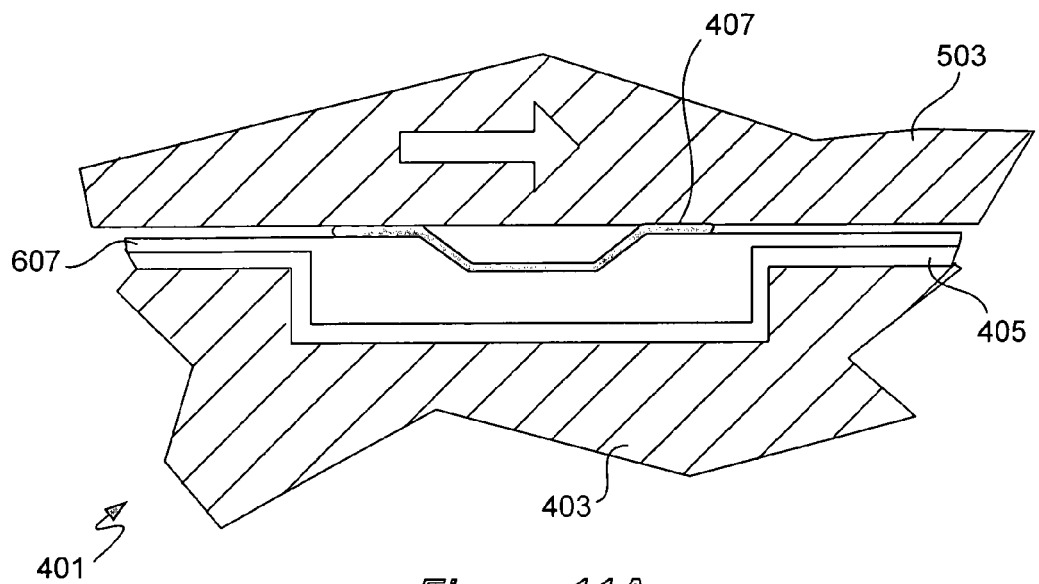
FIGS. 11A and 11B are schematic illustrations of a work piece as in FIG. 9, but after plating has proceeded to a point approaching planarity with exposed active film (FIG. 11A) and then with exposed film removed (FIG. 11B).
Figure 11B:
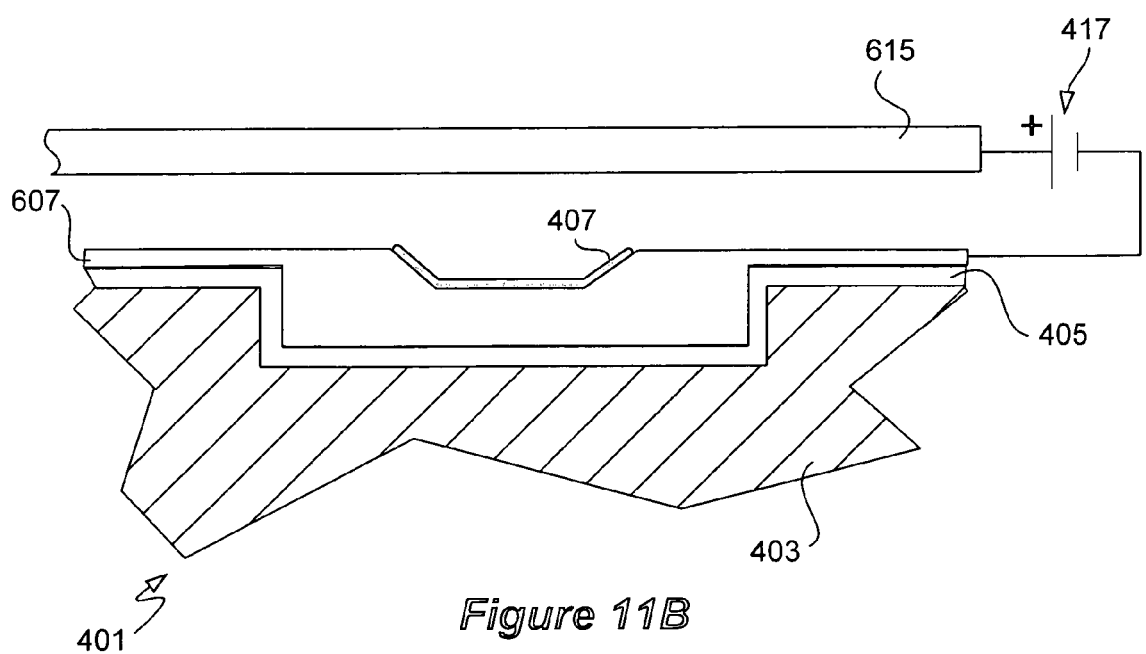
Figure 12:
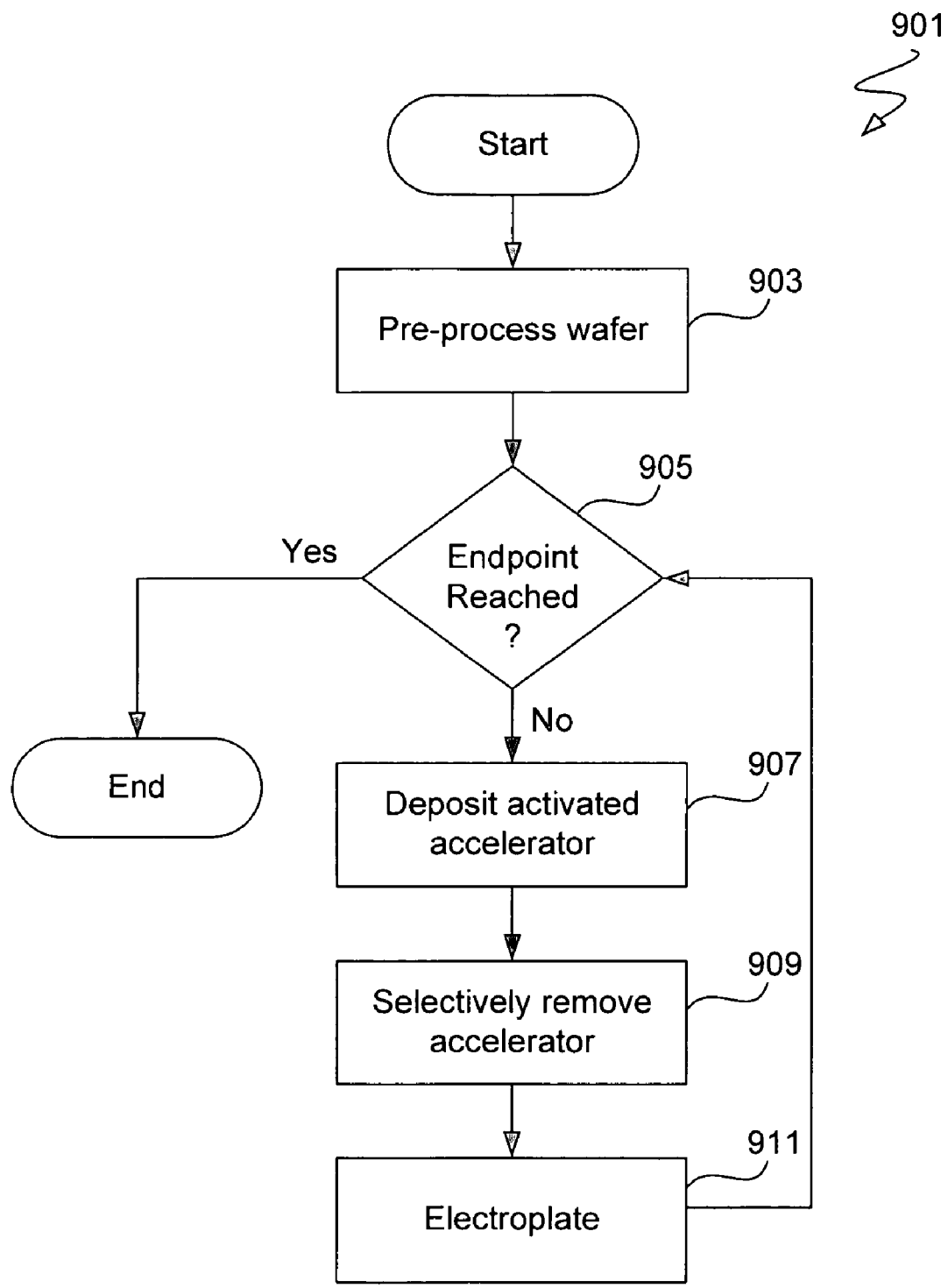
FIG. 12 is a flow chart showing use of end point detection in combination with an iterative approach selectively removing accelerator and plating.

If overplating is undesirable for a particular application, the process can be modified to remove activating film periodically during the electroplating operation. This process is depicted in FIG. 12 and FIGS. 11A and 11B. As shown there, a process 901 begins at a block 903 with optional pre-processing as described above in the context of FIG. 10. In the main sequence of the process, two or more of the basic process operations are performed sequentially (possibly with overlap), while the endpoint detection is performed periodically. Hence, an endpoint decision block 905 is shown as controlling entry to a loop on the inventive process operations. It is understood that block 907 is optional inside the processing loop of FIG. 12. It is possible that a sufficient quantity of accelerator film was deposited in the first pass that no further accelerator is required to maintain sufficient plating contrast.

After a sufficient quantity of activated accelerator film has been formed at block 907 (whether in the current pass or some previous pass), the process next selectively removes accelerator from the exposed regions at 909. See FIGS. 11A and 11B. Finally, at a block 911, the surface is electroplated with metal.

Thereafter process control returns to decision 905, where it is again determined whether the endpoint has been reached. The endpoint techniques described above, a combination of them, or other such techniques, may be used to determine when operations 907, 909, and 911 should be repeated. Such control minimizes the number of rubbing cycles and the final overburden thickness. Note that because of plating contrast some regions on the wafer surface that were recesses early in the process become exposed during the course of electroplating. Hence, the accelerator in these regions, which might have been protected from removal early in the process, becomes exposed and susceptible to removal in operation 909—during a later cycle. Thus, over time, less and less of the work piece surface contains the additive film and hence less and less of the surface is subject to accelerated plating.

In one particularly preferred process, once in the processing loop for the first time, the wafer is plated until a particular charge passed, optimized to be coincident with a point in the process where the first low aspect ratio feature will begin to emerge above the field plane. Thereafter, the electroplating rate is reduced to allow a planarization "soft-landing" characterized by cycles of increased amounts of rubbing and less plating occurring in rapid successions, until complete planarization is achieved as determined by the end point method. In this case, because the wafer finishes this process with essentially the entire original accelerator removed from the surface, simply monitoring for a rise in potential (for constant current plating) or reduction in current (for constant potential plating) can be a useful end-point detection method. The selective removal of additive may or may not be performed in the plating cell. Clearly there are advantages if the removal is performed in the cell. This however requires specialized hardware that can accommodate both electroplating and mechanical removal. On the other hand, repeatedly removing the wafer from the plating cell and mechanically rubbing it leads to an undesirable increase in process time. In either case the number of rubbing cycles generally should be reduced to a minimum.

Figure 13:
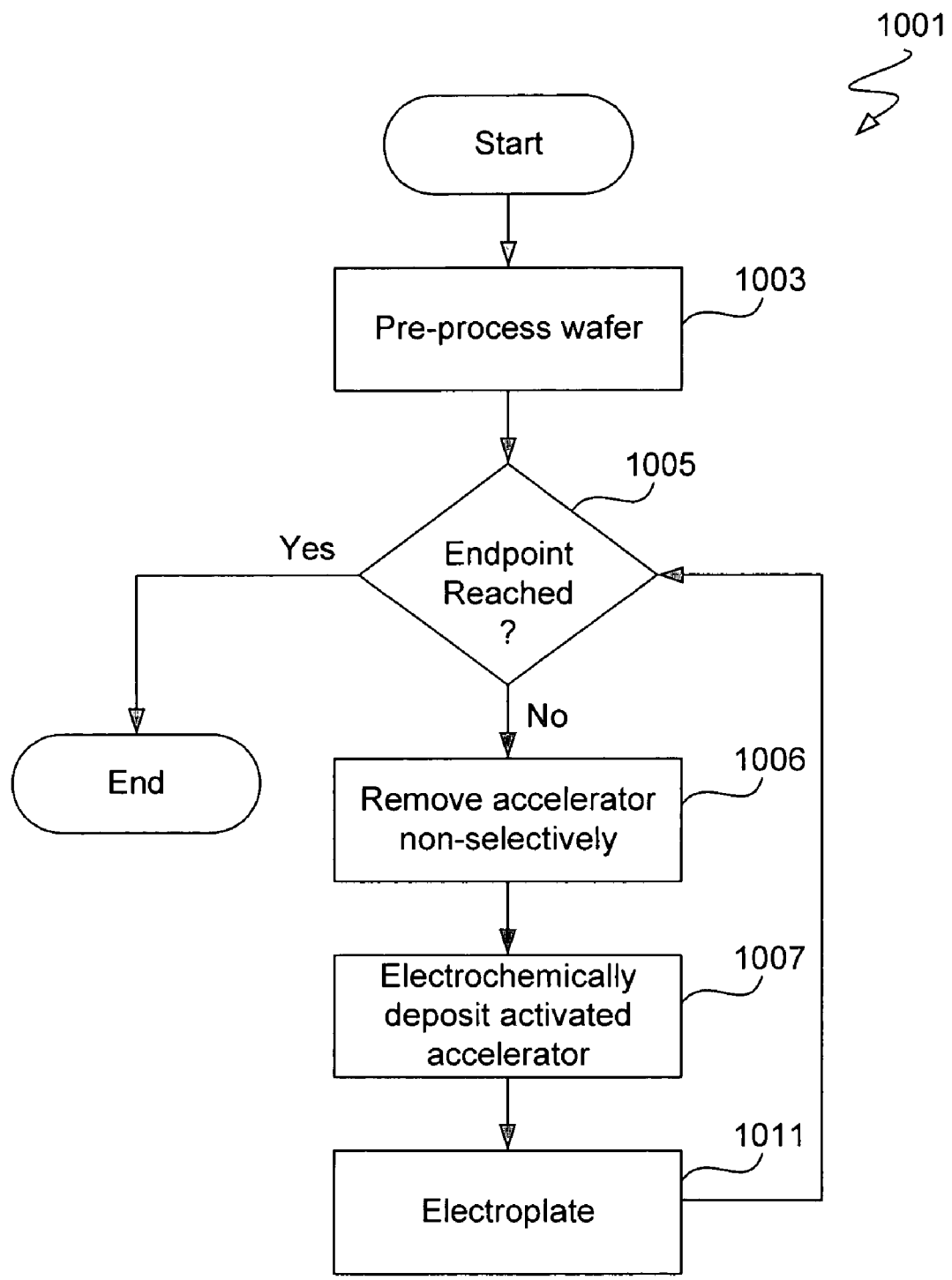
FIG. 13 is a flow chart of a process as in FIG. 12 but with additional iterative steps of removing all accelerator and then reforming an accelerator film.

In some cases, it can be advantageous to periodically remove the activation film everywhere, and thereafter reactivating the surface globally, and then re-rubbing the surface to "deactivate" the currently exposed regions (which may include some previously filled features). FIG. 13 shows a sample flow for this process. Such a process may be needed also if the activation provided by the particular accelerator used diminishes with time. While the need to reapply and selectively remove the accelerator is undesirable, other process considerations could make the use of such a material more economical or otherwise desirable. For example, if one accelerator can be very easily selectively removed with little or no pressure it would be favored over another accelerator, which requires a device-damaging pressure/force.

As shown in FIG. 13, a process 1001 begins pre-processing 1003 and entry to a loop via an endpoint detection decision 1005 as with the process of FIG. 12. Within the loop, however, there is an additional operation of removing the accelerator film non-selectively. See block 1006. This may be accomplished by chemical etching, current reversal, or other technique appropriate for the film in question and the overall process flow. After non-selectively removing the film, the method progresses through operations 1007, 1009, and 1011, which correspond to operations 907, 909 and 911 of FIG. 12.

Controlling Current and Potential During Plating

As initially recessed features become exposed (planar) during plating and the activating film in those regions is removed in iterative procedures such as those of processes 901 and 1001, the newly exposed regions will change state from activated to suppressed. Thus, the percent of surface area in the activated state decreases over the course of plating. In such situations, it may be undesirable to continually force a fixed amount of current through the surface of the work piece. To do so may reduce planarization contrast (as the potential changes) and present difficulties in precisely controlling plating near the end of the process. Therefore, it may be preferable to perform the metal plating operation in a controlled potential mode in which the plating rate will naturally decrease as the activating additive is removed. This avoids any unnecessary plating that would occur with galvanostatic plating.

In galvanostatic plating, as features are filled and the amount of activated additive layer is reduced, current continues to flow through the substrate at the same level. Because the surface is now more suppressed, the potential of the process will increase and a more-or-less conformal deposit will continue to be plated until the current is turned off.

Controlled potential plating ensures that as each feature reaches a state of planarization and has its activating film removed, the plating rate will decrease to that of the field area. The current previously going to the newly exposed feature is not redistributed to the rest of the surface (unlike the galvanostatic case), where it would increase the amount of metal plated on the exposed surface and reduce the planarization contrast. Instead, the potential is maintained constant (by the system electronics) and the current in the feature (and to the entire substrate) decreases as each recessed feature achieves planarization and has its activating film removed.

In addition to using a high impedence reference electrode, it is important to compensate for various ohmic system contributions when performing a potentiostatic operation. Therefore, the use of sense lines that make contact as close as possible to the metal of the work-piece surface are critically important.

Post SAP Feature Electrical Isolation

The goal of each level damascene processing is to produce a layer of isolated, metal features of various sizes and densities embedded in a dielectric. The various embodiments of the SAP process specified herein only create a planar surface of metal both over the field and the embedded features, but does not isolate the structures and therefore does not complete the damascene processing for a given level. One can use current technologies, such as CMP, to remove the field metal and isolate the structures. The methods of this invention reduce the cost of CMP processing and potentially reduce the necessary stress required for metal removal (particularly with the trend of using limited mechanical strength, low dielectric constant materials). However, SAP has a further advantage over current metalization methodologies because the planar surface that it creates enables the use of a lower cost, more reliable feature-isolation process.

Current copper damascene chemical mechanical planarization (CMP) performs four primary operations: 1) remove and planarize "overplated" metal found primarily over dense regions of high aspect ratio features, 2) remove overburden metal by planarizing the surface between low aspect ratio features and the field and 3) remove all field copper without removing significant copper from the feature (e.g without dishing or erosion), and 4) removing the barrier layer and electrically isolating the embedded features. The SAP process eliminates the need for the first two of these functions, but the removal of (the reduced thickness) field metal and line isolation must still be performed.

Because the metal is planar after SAP processing, any process what can remove field metal without removing significant metal from within the feature can be used. This inherently implies a process that is surface-reaction-rate controlled. As the field metal is removed and the feature exposed, diffusion kinetics improve because the structure is now two or three dimensionally accessible to its reactive open environment. A surface-reaction-controlled process inhibits the isolated feature from reacting more rapidly, because the rate of the process does not depend on the rate of diffusion of reactants to, or products from, the surface.

Koos et. al. (U.S. patent application Ser. No. 10/690,084 filed Oct. 20, 2003, incorporated herein by reference for all purposes) describes a process and preferred chemicals for surface reaction controlled etching useful in creating recessed feature from an initially planar structure of metal lines and vias embedded in a dielectric. An extension of this process is particularly useful in removing field metal (particularly copper) from the planar metal film produced by the SAP process. Suitable aqueous etchants typically contain complexing agents, oxidizers, and pH adjusters. The process is generally performed at a near neutral or slightly basic pH (e.g., about 7 to 10). Citric acid, glycine, and ethlyene diamine tetraacetic acid are some examples of suitable complexing agents. Useful oxidizers include oxygen, ozone, hydrogen peroxide, persulfate and permanganate ions. Adjusters of pH are typically alkali metal hydroxides, or organic cationic bases (e.g. tetramethyl ammonium hydroxide).

Because the process is substantially surface controlled, the particular method of etchant application is not particularly limiting. Suitable etching apparatus include spin spray etching, tank dipping, rotating in a bath, or a microcell thin film reactor described in U.S. patent application Ser. No. 10/609,518, filed Jun. 30, 2003, titled "Chemical Liquid Reaction Treatment Using Thin Liquid Layer," by Mayer et al., which is incorporated herein by reference for all purposes.

As an example, after copper plating a wafer with recessed embedded feature using a SAP process as described above, the wafer is subject to a spray of etching solution containing 2 g/L glycine and 100 g/L hydrogen peroxide. The etch rate is nominally 200 Å/min and can be changed by varying the reactant concentrations between 1-8 g/L glycine and 0 and 100 g/L hydrogen peroxide. The process is continued until all copper is removed from the field and the lines are isolated. Visual (our automated optical) observations can be used to observe the change in reflected light color and intensity as the field metal clears and determine an end-point for the process. Similarly, using suitable means etching chemical can be directed only to particular portions of the wafer were field metal remains, mitigating any over etching in cleared field area.

Various methods can be used to remove the thin barrier metal that will still connect the individual lines after etching. These include using a separate surface reaction rate controlled wet-etch, that is relatively inactive to interconnect metal removal but capable of removing the barrier. Other options include a non- or barrier-selective mechanical or chemical/mechanical polish similar to that currently used in industry. Still another option is to use a gas phase reactive ion etch (e.g., using $SF_6$ or $BF_4$), or simply ion bombarding and sputtering of the surface to removal the surface layers.

Apparatus

In some embodiments, the apparatus employed with this invention accommodates the following procedures: global application of activated additive layer, selective removal of the layer from exposed regions, and electroplating. One, two or three separate modules may be used for this purpose.

To globally form the accelerating layer, one may use an electroplating cell similar to a conventional cell such as the Sabre™ plating cell of Novellus Systems, Inc. (San Jose, Calif.). This is appropriate when electrochemical activation of an additive precursor (e.g., a dimer as described above) is required. The potential and/or current to the work piece are controlled to ensure that the activated additive layer forms properly.

If the activated additive layer is formed by an electroless process, a different module may be appropriate. For this one may use an electroless cell or any suitable construction. One preferred example is a "microcell" such as that described in U.S. patent application Ser. No. 10/609,518, filed Jun. 30, 2003, previously incorporated herein by reference.

If spraying or immersing the wafer in a solution containing a self-activating accelerating compound is employed, then a relatively simple apparatus for holding the solution and temporarily accommodating the work piece may be employed. If the solution is particularly valuable or if its disposal costs are prohibitive, it may be desirable to reuse the solution several times. Immersing the wafer into a tank containing the accelerator solution and spinning off excess entrained fluid would then be useful. Alternatively, embodiments similar to those described in U.S. patent application Ser. No. 10/609,518 in which the reacting solution is collected in various troughs for reuse can be used. After application of the accelerant, the wafer can be rinsed and/or dried and/or stored if desire.

The module employed to selectively remove additive from the exposed surface regions may include a mechanism from rubbing or otherwise selectively affecting the exposed regions. As indicated, a pad is often suitable for this purpose. Thus, a conventional or slightly customized CMP apparatus may be used for the purpose. Typically, the module will not employ a CMP slurry or other abrasive medium—although this not a requirement of the invention. Note that the invention may employ a hybrid module containing both a CMP-like pad (with wafer holder and platen) and appropriate features for globally applying the active additive layer. With such module one can produce the selectively activated work piece in a single module.

The plating operation may be performed in any conventional plating apparatus. Although, in some embodiments, it may be modified to allow global deposition of the active additive and/or selective removal of the additive from the exposed surfaces. The apparatus may be designed to permit these operations to be performed simultaneously or sequentially. Also, one operation can be performed on one part of the wafer, while another portion of the wafer is having a different operation performed.

In the case of the electrochemically activating processes, the activation is preferably performed in the same bath as that used to perform the electroplating. In a specific approach, using the apparatus to initially deposit the metal at a sufficiently high current or potential for a short period of time (2-20 seconds) will create an activating layer. The relevant module should also include a pad (or other mechanical element) to selectively remove the additive layer at least once during the plating operation.

After plating the planarized film, it is often desirable to anneal the metal layer. Annealing can allow grain coalescence and growth, strain relaxation, reduced electrical resistances, within-line micro-void expulsion, and improved electromigration performance and device life. Typical conditions for annealing are vacuum, inert atmosphere, or slightly reducing atmospheres at about 150 to 450° C. for about 20 second to 8 hours.

In summary, an apparatus for plating a metal layer onto a work piece in accordance with this invention may generally have the following elements: (a) a vessel for containing at least one of an activating solution and a plating solution; (b) a work piece holder within the vessel for holding the work piece during activation and/or plating; and (c) a mechanically rubbing element for contacting the surface of the work piece in a manner that selectively removes the accelerator from the exposed regions. In some embodiments, separate vessels may be employed for activation and plating. Generally, apparatus will contain or be adapted to connect with a source of an activating solution comprising an accelerator and a source of a plating solution comprising the suppressing compound and a lower concentration of the accelerator than is present in the activating solution. If the plating the process is electroplating, then the apparatus will also include electrical connections for applying a negative potential to the work piece and a positive potential to an anode. In such systems, the apparatus may further include a control system for controlling at least one of the current or potential applied to the electrical connections. As explained elsewhere, the mechanically rubbing element preferably comprises a microrough polymeric material and may be in the form of a pad.

Figure 18:
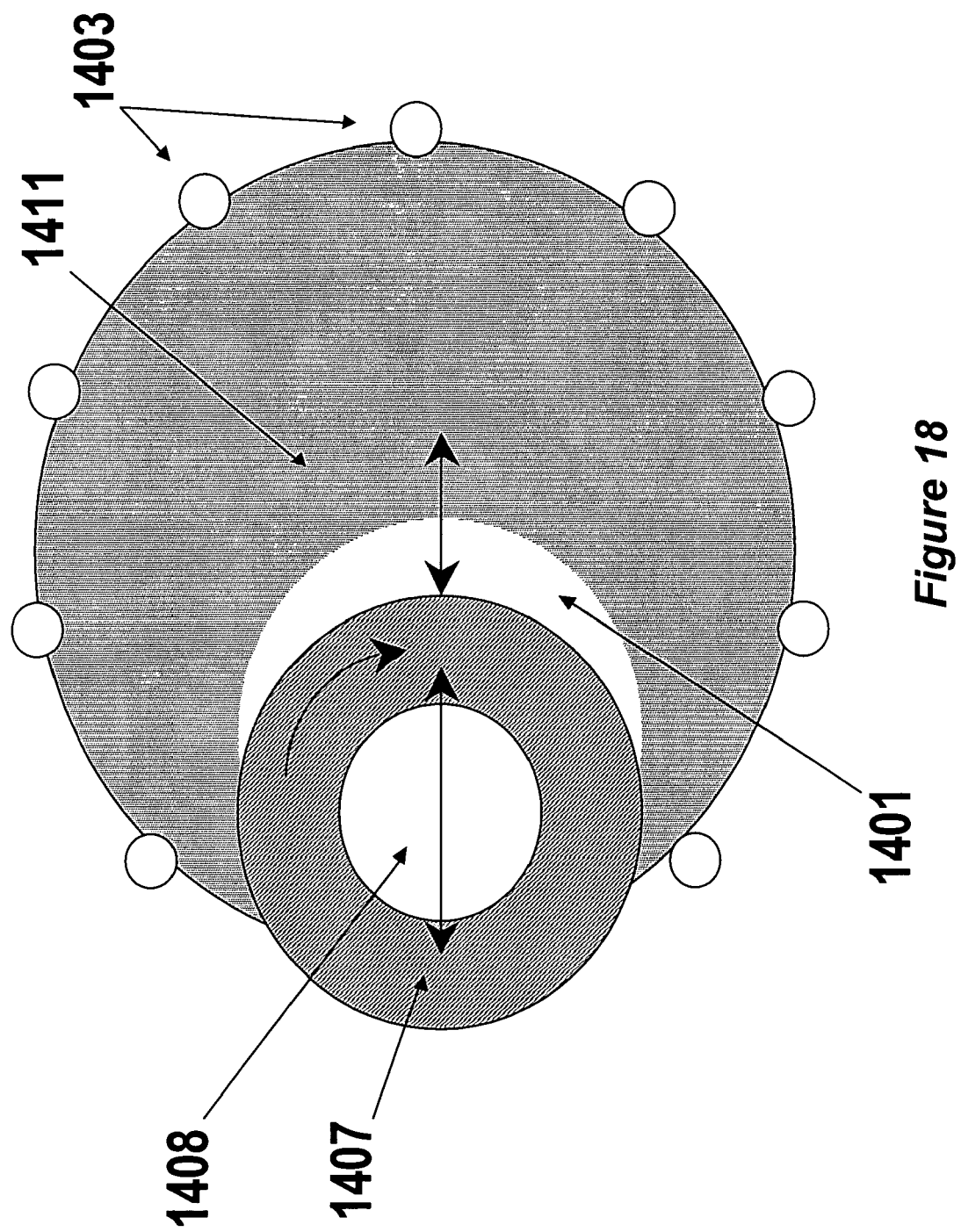
FIG. 18 is a top-down schematic representations of an apparatus used to remove accelerating film from one portion of a wafer and plate a different portion of a wafer simultaneously (as in FIGS. 14-17 for example).

FIGS. 14 to 17 show various prospective views and FIG. 18 is a top-down schematic of a particular apparatus embodiment (1400 in various configurations). This embodiment is suitable for performing many of the processes previously described. A wafer or work piece (1401) is resident inside a general containment vessel (1402). The work piece is confined and held by a set of edge confinement cylinders (1403) that can also act as edge electrical contacting members if appropriate rotary electrical contacts are used. The confinement cylinders can also either actively rotate (driven by a motor) to induce rotation, or can be slave to the general work piece rotation imposed by some other means (not shown). Note that confinement cylinders 1403 may have an axially varying diameter, preferably with the top and bottom axial regions having a larger diameter than the center axial region as shown. In some embodiments, the work piece is supported by a platen or other support mechanism, which may comprise electrical contacts for plating or activating the work piece.

One or more spray nozzles (1404) can be arranged around vessel 1402 for rinsing the work piece front and back before or after the process, and for chemically treating the surface (e.g., activating the surface by spraying a solution containing an accelerator). The accelerator can be sprayed onto the wafer to activate the surface for bottom-up filling (using a relatively low concentration of accelerator) as a prelude to the SAP process, or for the SAP process itself (using a substantially higher concentration of accelerator, as described above). A pad 1405 is attached to a substantially flat support member 1406, typical using a strong adhesive, creating a pad assembly 1407. The pad can be, for example, a commercially available type, such as IC1000 from Rodel. The support member 1406 typically includes appropriate hardware allowing the pad and support to be gimbaled about the axial center so the surface of the pad naturally assumes the plane of a work piece when it is engaged. The pad assembly 1407 is attached a drive shaft 1408, which can rotate the assembly, moving it up and down, towards or away from the work piece, and translate in a general direction to and from the center of the work piece. The drive shaft is attached to appropriate motors and other mechanistic hardware that such movement, as well as a pneumatic or other type mechanism used to control the pressure that the pad applies to the surface as it rubs the wafer and performs work. For simplicity, examples of such mechanisms, known in the various trades of engineering, are not shown. Lubricants and other materials useful in the pad rubbing process can be introduced through the pad itself, from the spray nozzles onto the wafer and by rotation brought under the pad, and/or from fluid supplied from the plating head (see below).

Because the work piece is often thin and of limited mechanical strength (e.g., a silicon wafer), an optional supporting assembly 1409 can be used. Like the pad assembly, it can be rotated and moved vertical in the apparatus to engage the wafer. However, it typically does not need to be gimbaled, or have lateral movement or applied-pressure controlling mechanisms. A support pad 1410 of the supporting assembly 1409 is generally a soft, elastic or sponge-like material, capable of supporting the weight of the applied rubbing force globally, but responding to minor displacement as required. When the supporting member is an off center disk as show, the friction generated between the supporting member 1409 and work piece 1401 should be less than that between the work piece 1401 and the pad assembly 1407. Alternatively, the wafer can be supported on a flat platen substantially the same size and the work piece, and held while it rotate with the rotation of the work piece as a whole. Friction between the back of the work piece and the supporting member can be obtained by either using an appropriate material (e.g. various rubbers) or by using vacuum (e.g., using a vacuum chuck).

Figure 15:
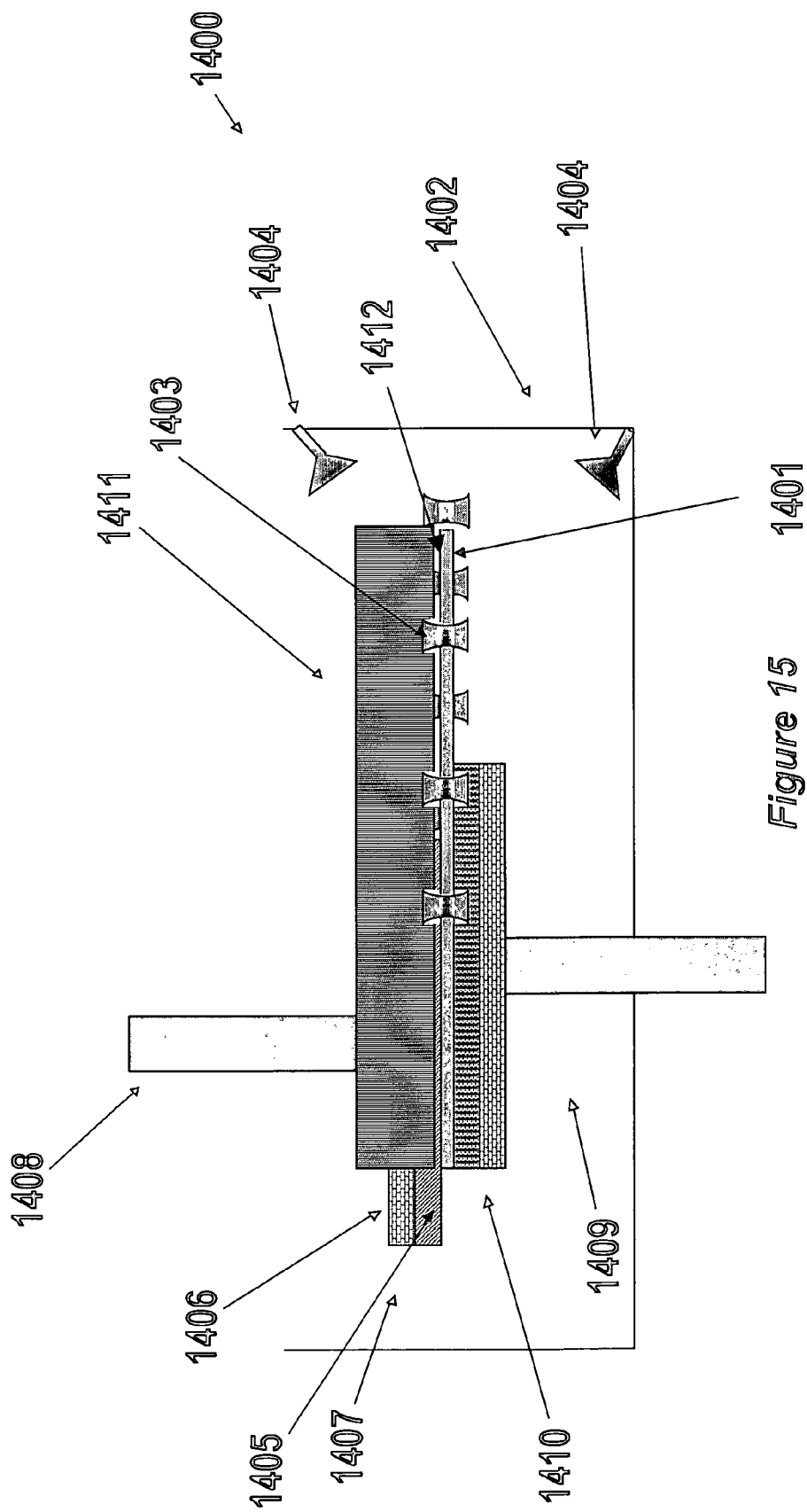
FIG. 15 is a schematic representation of the apparatus of FIG. 14, with the apparatus in a simultaneous plating and rubbing configuration.
Figure 16:
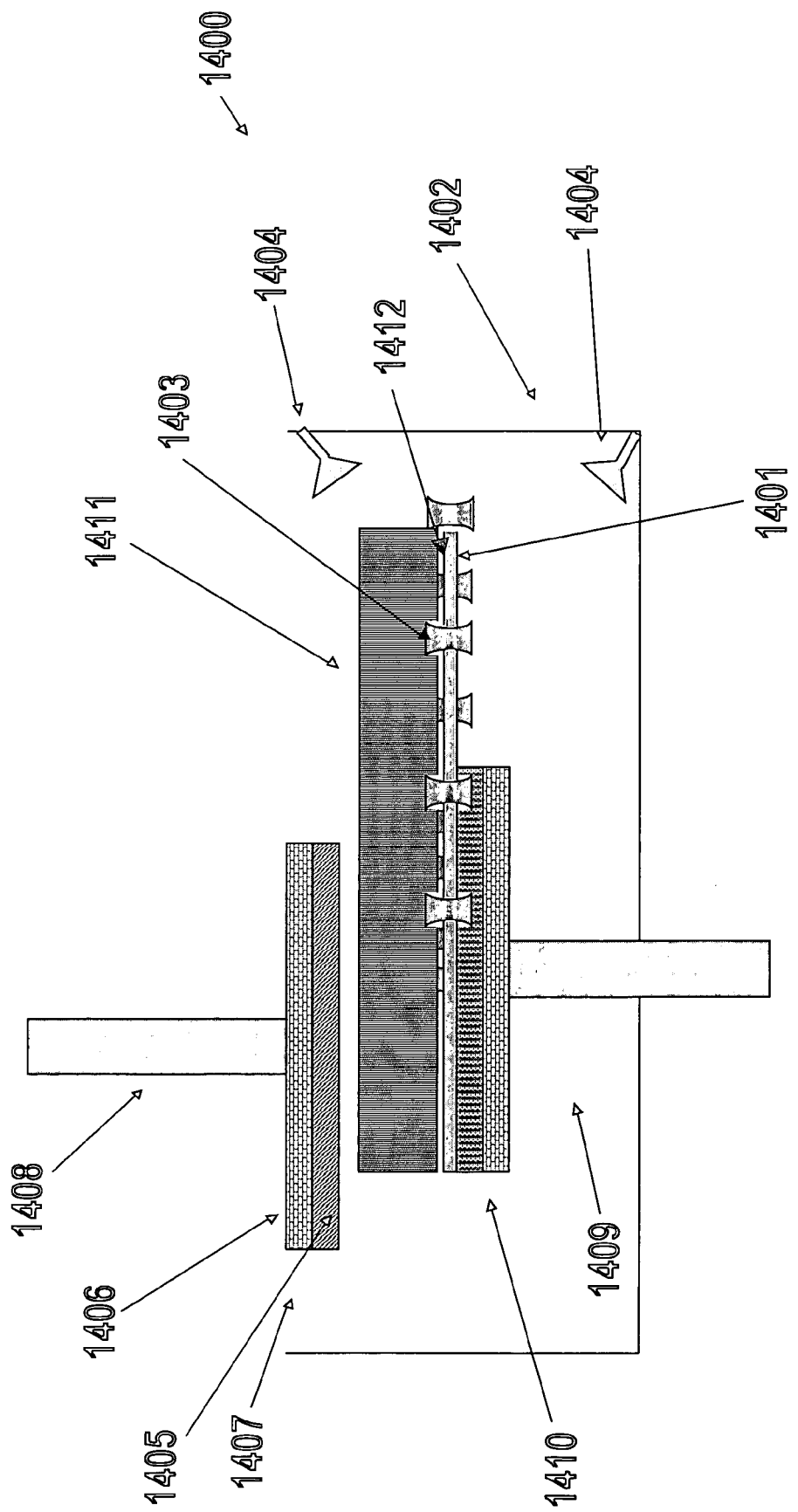
FIG. 16 is a schematic representation of the apparatus of FIGS. 14 and 15, with the apparatus in a plating only configuration.
Figure 17:
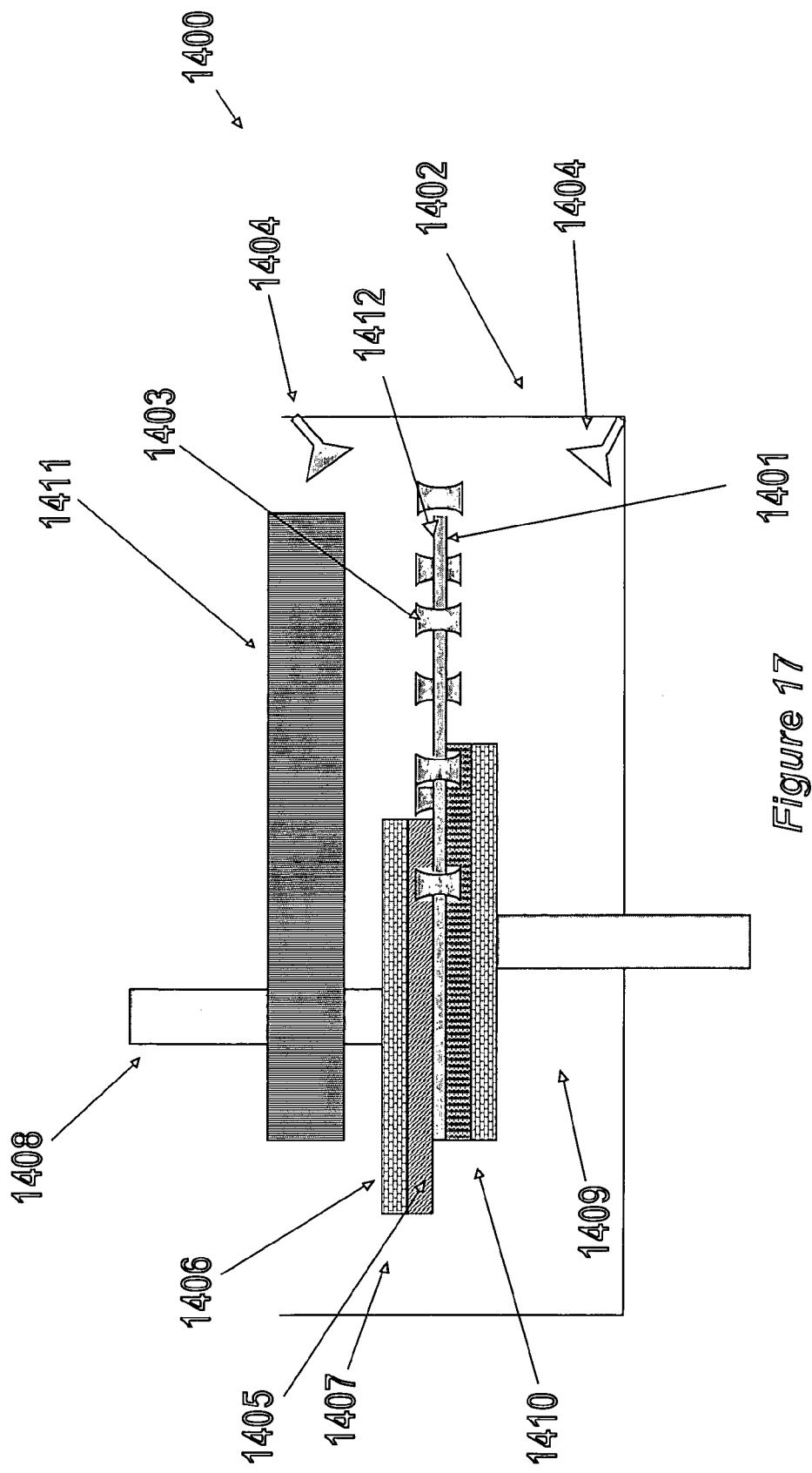
FIG. 17 is a schematic representation of the apparatus of FIGS. 14-16, with the apparatus in a rubbing only configuration.

The wafer can be plated using a thin film reactor head 1411 in the down position (FIGS. 15 and 16). As described in U.S. patent application Ser. No. 10/609,518 the reactor head 1411 of a thin film reactor can be moved in close proximity (e.g., about 0.5 to 3 mm) to the wafer to create a thin-film gap 1512. In accordance with this invention reactor head contains or actually serves as an anode. An associated control system ensures that the head is precisely positioned in at least the z and theta (angular) positions with respect to the work piece surface to ensure that the head stays a fixed distance from all regions of the work piece surface.

After appropriate surface activation's and pretreatments (optionally performed with the apparatus in a configuration such as that shown in FIG. 14), the head can be lowered, and the gap 1512 so created, can be flooded with an appropriate electrolyte to perform high aspect ratio bottom up filling or low aspect ratio SAP electroplating (as described herein).

Typically, the fluid is introduced into the gap through the head and out a hole or group of holes or nozzles at the bottom surface of the reactor head 1411 (nozzles and holes not shown). The head is connected to an appropriate power supply so that it can polarized and act as an anode (or cathode, if pulse-reverse plating, electropolishing, electroetching are to be performed).

In one particularly preferred embodiment, an interface 1413 of the head 1411 that creates the gap 1512 and is wetted with the plating electrolyte should be non-porous, and made of a material which is generally electrically conductive and not corroded at the anodic potentials likely to be encountered during operation, and is chosen from those materials known in the art as substantially "inert", or "dimensionally stable" anodes (electrodes) materials. The electrode surface can be the same as the bulk material making up the head, or the head can be of a different conducting material and coated with the interfacial film 1413 or the dimensionally stable material. In this case, this limits the choices of interface materials to those that do not corrode in the plating electrolyte at the desired pH and the oxygen evolution potentials. Oxygen evolution (rather than anode dissolution) is the preferred reaction occurring at the anode. Suitable materials for a chemically thermodynamically stable film include platinum, gold, ruthenium, iridium, and other noble metals and alloys. Passive state dimensionally stable anodes materials include titanium, tungsten, and tantalum, for example.

In an alternative embodiment, the head 1411 contains an active metal anode (e.g. copper metal when plating copper), and various filter and flow routing constructs to mitigate known issues with plating from a consumable electrode. Unlike the current state-of-the-art plating methods which require high current densities to create the overburden layer, the plating currents used during high aspect ratio bottom-up-filling and the SAP process are relatively low (average current density is typically less than about 10 mA/cm$^2$). Therefore, the rate of oxygen formation is also going to be low, and the oxygen generated is reasonably easily dissolved into a flowing electrolyte stream without the formation of defect forming oxygen bubbles. Furthermore, the relatively high potentials that the dimensionally stable anodes need to evolve oxygen very rapidly decompose dissolved accelerators in state-of-the-art plating baths. Because little or no accelerators are used in the SAP process bath, a high anode potential is of no consequence. The dimensionally stable anode has the advantage of being a no-operating cost and maintenance free system component.

In the most general case, both the head 1411 and the pad 1405 can move with respect to the wafer center, allowing the wafer to undergo periods of plating and rubbing as the wafer simultaneously rotates. Alternatively, the head and pad can maintain a fixed relation and as a group and move back and forth over the wafer center. In this case the head should be slightly larger than the wafer so that the edge regions are always plated. Other embodiments are also possible.

Figure 14:
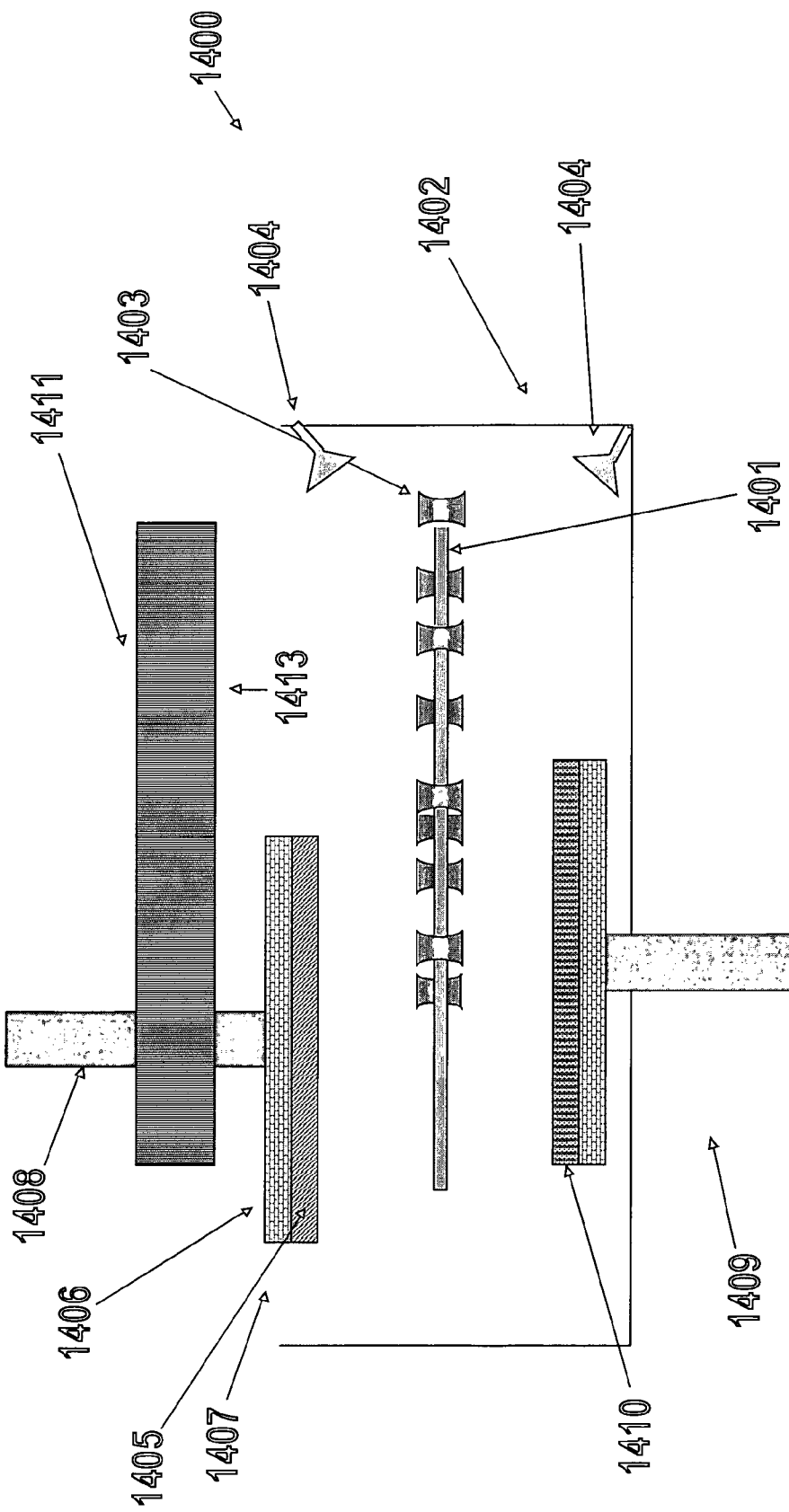
FIG. 14 is a schematic representation of an apparatus used to remove accelerating film from one portion of a wafer and plate a different portion of a wafer simultaneously, with the apparatus in an activation spraying, rinsing, or drying configuration

To obtain a uniform plating across the work piece, the time that any particular point of the work piece sees the anode should be the substantially the same. To accomplish this, analysis of the appropriate head motion and the active area of the anode can be performed and modified appropriately. For example, the active area can be modified by having a portion of the head 1411 contain a non-active region (e.g., made of a plastic or other inner material). Alternatively, various methods of field shaping can be used as known in the art (see for example U.S. Pat. No. 6,402,923, "Method and Apparatus for Uniform Electroplating of Integrated Circuits Using a Variable Field Shaping Element", Mayer et. al. issued Jun. 11, 2002). Still further, the anode can be divided into various segments to spatially modify the total time and current density applied as a function of time, in a manner similar to that described in U.S. patent application Ser. No. 10/154,082 filed May 22, 2002, titled "METHOD AND APPARATUS FOR UNIFORM ELECTROPLATING OF THIN METAL SEEDED WAFER USING MULTIPLE SEGMENTED VIRTUAL ANODE SOURCES" by Mayer et al., and U.S. patent application Ser. No. 10/116,077 filed Apr. 4, 2002, both of which are incorporated herein by reference for all purposes. The wafer is rotated between the region under the pad 1407 and the thin film head 1411. Depending on the stage of the process and the desire results, the pad may (FIGS. 15 and 17) or may not (FIGS. 14 and 16) be engaged to remove accelerator film from the surface at any particular point in the overall plating operation. Similarly, the plating head can be up and the pad down during another points in the process. Or both the plating head and pad can be up, for application of accelerators, or rinsing for example (FIG. 14).

An example is useful in illustrating the states of the hardware and their positions. First, both the head 1411 and the pad 1407 are in the up positions (FIG. 14), and a rotating wafer is sprayed with water to pre-wet the surface (from nozzle 1404, for example). Next, the water is turned off and the wafer is exposed to a bottom-up fill activating solution (this can be supplied through the same nozzle 1404, or a separate nozzle plumbed to the activation solution). Next, the plating head 1411 is brought down to create a plating gap 1512, and the gap is flooded with plating solution (FIG. 16). In this case the plating solution is substantially devoid of any accelerating component. The wafer is then plated to a point where the smallest features begin to fill. (Note that small high aspect ratio features will tend to fill first under conditions leading to geometrical acceleration). At this point in the process, the pad 1407 is lowered (FIG. 15) to remove accelerator from the top of features as metal at the top of the feature (with their associated higher surface accelerator concentration) begins to emerge above the plane of the field. This process step is generally continued until all features with aspect ratios higher than about one have been filled and are substantially flat to the field plane. Significantly, the rubbing process eliminates the accelerator over the features, the disparity in plating rates over the surface as a whole, and the propensity for the features to continue to grow at an accelerated rate. This fact enables one to avoid the need to place a suppressing leveling additive in the filling bath (typically used to suppress the surface active regions over the features created by the geometrically induced concentration of accelerator). Alternatively, a bath containing a leveler (leveling additive) can be used during the initial filling sequence of the process and rubbing at this stage avoided.

The next step of the process is to activate the surface again with an activating solution appropriate for SAP processing. One method of doing this is to have the electrolyte removed from the plating head gap 1512, and the pad and plating head are raise above the wafer to allow the surface to be sprayed with activation solution (configuration of FIG. 14). After spraying the surface with activator, excess entrained activator is spun off and the surface optionally rinsed with deionized (DI) water (to avoid contaminating the plating solution with accelerator in the next plating step). Next, the pad 1405 is brought into contact with the wafer and an appropriate lubricating fluid (as discussed above) is supplied to the pad/workpiece interface by any appropriate means (configuration of FIG. 17). After the wafer has removed substantially all of the accelerator chemical from the wafer's field regions, the pad and pad assembly are lifted off the wafer, and the plating head is lowered again, followed by gap flooding with plating electrolyte (configuration of FIG. 16). Depending on the desired performance and cost, the same or a different electrolyte used in the bottom-up filling process above can be used for the SAP plating. The most likely and notable difference between the solutions is the presence the lack of any (undesirable) leveling additive component in this second plating step, SAP processing bath. Similar to the operation in the bottom-up filling bath, plating should continues to a point just before metal from the low aspect ratio features begin to emerge to the field level. At this point the rubbing pad assembly 1407 is again lowered to remove the accelerator form the previously recess feature regions (configuration of FIG. 15). After the surface has reach a state of planarization, the plating is terminated, the assemblies are raised, the wafer is rinsed and the plating process is finished. Optionally, the wafer can then be etched by spraying appropriate etchants (described above) on the surface, or the plating gap head 1411 can be lowered and an etchant can be introduced into the gap to create a thin reactor etching film. When metal is removed from the field, but not within the features, the etching is stopped, the wafer is rinsed, and the then dried.

In various ones of the embodiments described above, the surface of the work piece is alternately and repeatedly plated and then selectively activated. Preferably these operations each have periods of at least about 0.5 seconds, and more preferably at least about 2 seconds. In some embodiments employing apparatus as presented in FIGS. 14-18, the plating and selective activation (e.g., using a pad) takes place simultaneously on different portions of a work piece for periods exceeding about 0.5 second, and more preferably exceeding about 2 seconds. This "alternating process" may also be embodied in a relatively slow moving mask passing over the work piece surface to periodically to remove activator from field regions. In some embodiments, the plating solution will have activator that continually deposits on the work piece surface. In other embodiments, the plating solution will be substantially free of such additives.

Other Embodiments

Although various details have been omitted for clarity's sake, various design alternatives may be implemented. For example, while the above description has focused primarily on integrated circuit applications, the invention may be useful in depositing metal layers on many other types of work pieces, including mirrors, various mechanical tools, circuit boards, etc. The present examples are to be considered as illustrative and not restrictive, and the invention is not to be limited to the details given herein, but may be modified within the scope of the appended claims.

What is claimed is:

1. A method of planar plating, the method comprising:
   (a) providing a work piece having a surface with recessed regions and exposed regions;
   (b) plating metal onto the work piece under conditions that promote bottom-up fill in high aspect ratio features, whereby recessed regions of the work piece having relatively high aspect ratio are filled with metal, while at least some recessed regions having relatively lower aspect ratio are not substantially filled;
   (c) after (b), causing a plating additive to become attached to the surface selectively in the recessed regions, with relatively little or no plating additive attached to an exposed surface; and
   (d) after (c) is at least partially complete, plating the metal onto the surface, whereby the additive selectively attached to the surface increases the rate of metal plating in the recessed regions relative to the rate of metal plating in the exposed regions, wherein (c) and (d) are performed during contact with a first solution and during contact with a second solution, respectively, and wherein the first solution comprises a greater concentration of the additive than the second solution, and wherein plating metal in (b) is performed using a plating solution that is different from the first solution.

2. The method of claim 1, wherein the additive is an accelerator, which acts to remove suppression of a suppressing compound and is bound to the surface.

3. The method of claim 2, wherein the accelerator is selected from the group consisting of 2-mercaptoethane-sulfonic acid (MESA), 3-mercapto-2-propane sulfonic acid (MPSA), dimercaptopropionyl sulfonic acid (DMPSA), dimercaptoethane sulfonic acid (DMESA).

4. The method of claim 1, wherein at least some of the recessed regions have an aspect ratio of less than one.

5. The method of claim 1, wherein the work piece is a partially fabricated integrated circuit.

6. The method of claim 5, wherein the recessed regions comprise trenches and/or vias.

7. The method of claim 5, wherein the metal is copper.

8. The method of claim 1, wherein (c) comprises:
   (i) adsorbing the additive on the work piece surface; and
   (ii) selectively removing the adsorbed additive from the exposed region.

9. The method of claim 8, wherein (i) comprises contacting the work piece surface with a solution containing an activator.

10. The method of claim 8, wherein (ii) comprises contacting the surface with a pad that selectively removes the adsorbed additive from the exposed region.

11. The method of claim 10, wherein the pad comprises a microrough polymeric material.

12. The method of claim 10, wherein contacting the surface with the pad is performed for a period of time and then stopped prior to (d).

13. The method of claim 10, wherein contacting the surface with the pad is not performed for at least a portion of operation (d).

14. The method of claim 8 wherein (ii) comprises contacting the surface with a lubricating solution and a mechanically rubbing element that selectively removes the adsorbed additive from the exposed region.

15. The method of claim 14, wherein the lubricating solution comprises an oxidizing agent.

16. The method of claim 1, wherein the second solution comprises either a halide and a suppressor or a halide without suppressor.

17. The method of claim 1, wherein the concentration of additive in the second solution is substantially zero.

18. The method of claim 1, further comprising removing the plating additive from exposed regions at least once after the plating in (d) has commenced.

19. The method of claim 18, further comprising applying the additive to the work piece surface during (d) but prior to removing the additive from the exposed regions.

20. The method of claim 1, wherein (d) comprises electroplating the metal onto the surface in a controlled potential mode.

21. The method of claim 1, wherein (d) comprises electroplating the metal onto the surface by controlling current.

22. The method of claim 1, further comprising repeating (c) and (d).

23. The method of claim 1, further comprising:
   (e) removing metal and barrier material from field regions of the work piece to thereby electrically isolate embedded features of the work piece.

24. The method of claim 23, wherein both (c) and (e) comprise contacting the work piece with a single mechanically rubbing element.

25. The method of claim 1, wherein processes (c) and (d) are performed alternately and simultaneously on different portions of the work piece for periods exceeding about 0.5 seconds.

26. The method of claim 25, wherein (c) comprises:
(i) adsorbing the additive on the work piece surface; and
(ii) selectively removing the adsorbed additive from the exposed region.

27. The method of claim 1, wherein processes (c) and (d) are performed alternately and simultaneously on different portions of the work piece for periods exceeding about 2 seconds.

28. The method of claim 1, wherein causing the plating additive to become attached to the surface selectively in the recessed regions comprises:
(i) contacting the work piece surface with a first solution having an accelerator, which is adsorbed to the point of saturation on the surface; and
(ii) selectively removing the accelerator from exposed surfaces while leaving a greater concentration of the accelerator in the recessed regions surface.

29. A method of planar plating, the method comprising:
(a) performing a bottom-up fill process on a work piece which results in the work piece having a surface with recessed regions and exposed regions, wherein at least some of the recessed regions have aspect ratios of not greater than about 1;
(b) after (a), contacting the work piece surface with a first solution having a plating additive, which binds to the surface, wherein the first solution was not used in (a);
(c) selectively removing the additive from exposed surfaces while leaving a greater concentration of the additive in the recessed regions surface;
(d) contacting the work piece surface having the additive selectively removed in (c) with a second solution having a lower concentration of the plating additive than is present in the first solution; and
(e) plating a metal from the second solution onto the surface, whereby the plating additive in the recessed regions increases the rate of plating in the recessed regions relative to the exposed regions.

30. The method of claim 29, wherein the second solution is substantially free of the plating additive.

31. The method of claim 29, wherein at least some of the recessed regions have aspect ratios of not greater than about 0.5.

32. The method of claim 29, wherein (c) comprises contacting the surface with a lubricating solution and a mechanically rubbing element that selectively removes the adsorbed additive from the exposed region.

33. The method of claim 32, wherein the lubricating solution comprises an oxidizing agent.

34. The method of claim 32, wherein the pad comprises a microrough polymeric material.

35. The method of claim 29, further comprising, prior to (b), plating the metal onto the work piece under conditions that promote bottom-up fill in high aspect ratio features, whereby features of the work piece having relatively high aspect ratio are filled with metal, while features having relatively lower aspect ratio are not substantially filled.

36. The method of claim 29, wherein the second solution comprises either a halide and a suppressor or a halide without suppressor.

37. The method of claim 29, further comprising:
(f) removing metal and barrier material from field regions of the work piece to thereby electrically isolate embedded features of the work piece.

38. The method of claim 37, wherein both (c) and (f) comprise contacting the work piece with a single mechanically rubbing element.

39. The method of claim 28, wherein plating the metal onto the surface comprises contacting the work piece surface with a second solution comprising a suppressor and having no accelerator or a lower concentration of the accelerator than is present in the first solution.

* * * * *